(12) United States Patent
Li et al.

(10) Patent No.: US 9,466,814 B2
(45) Date of Patent: Oct. 11, 2016

(54) ORGANIC ELECTROLUMINESCENT DEVICE

(75) Inventors: Jingbo Li, Kanagawa (JP); Shinichiro Sonoda, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 0 days.

(21) Appl. No.: 13/883,107

(22) PCT Filed: Oct. 18, 2011

(86) PCT No.: PCT/JP2011/073881
§ 371 (c)(1),
(2), (4) Date: Nov. 12, 2013

(87) PCT Pub. No.: WO2012/060209
PCT Pub. Date: May 10, 2012

(65) Prior Publication Data
US 2014/0054567 A1    Feb. 27, 2014

(30) Foreign Application Priority Data
Nov. 4, 2010    (JP) ................................. 2010-247531

(51) Int. Cl.
*H01L 29/08*    (2006.01)
*H01L 35/24*    (2006.01)
*H01L 51/00*    (2006.01)
*H01L 51/52*    (2006.01)

(52) U.S. Cl.
CPC ....... *H01L 51/5268* (2013.01); *H01L 51/5262* (2013.01); *H01L 51/5221* (2013.01); *H01L 2251/558* (2013.01)

(58) Field of Classification Search
CPC .......... H01L 51/5268; H01L 51/5265; H01L 51/5275; H01L 2251/5369; H01L 51/0052; H01L 51/0059; H01L 2251/5361; H01L 2251/558; H01L 27/322; H01L 51/5012; H01L 51/5036; H01L 51/5271; H01L 2251/5315
USPC .............. 257/79–103, 40–47; 313/110–117, 313/483–52; 427/64–68
See application file for complete search history.

(56) References Cited

U.S. PATENT DOCUMENTS

| | | | |
|---|---|---|---|
| 2004/0061136 A1* | 4/2004 | Tyan | H01L 51/5268 257/200 |
| 2009/0066219 A1* | 3/2009 | Handa | H01L 51/5268 313/503 |
| 2010/0187987 A1* | 7/2010 | Nakamura | H01L 51/5268 313/504 |

FOREIGN PATENT DOCUMENTS

| | | |
|---|---|---|
| JP | 08-083688 | 3/1996 |
| JP | 2004-127942 | 4/2004 |

(Continued)

*Primary Examiner* — Thao X Le
*Assistant Examiner* — Nduka Ojeh
(74) *Attorney, Agent, or Firm* — Riverside Law LLP

(57) ABSTRACT

Provided is an organic electroluminescent device including, in an order mentioned: a reflective electrode; an organic electroluminescent layer; a light extraction layer; and a transparent substrate, wherein a ratio (w/d) is 9 or more where "d" denotes a total average thickness from the organic electroluminescent layer to the transparent substrate and "w" denotes a minimum width of a non-light-emitting region present outside of an outer periphery of an effective light-emitting region in the organic electroluminescent layer.

13 Claims, 11 Drawing Sheets

(56) References Cited

FOREIGN PATENT DOCUMENTS

| | | |
|---|---|---|
| JP | 2004127942 | 4/2004 |
| JP | 2004-296429 | 10/2004 |
| JP | 2005-317254 | 11/2005 |
| JP | 2005317254 | 11/2005 |
| JP | 2008523546 | 7/2006 |
| JP | 2008-523546 | 7/2008 |
| JP | 2009-054493 | 3/2009 |
| JP | 2009054493 | 3/2009 |
| JP | 2010182449 | 8/2010 |

* cited by examiner

ORGANIC ELECTROLUMINESCENT DEVICE

CROSS-REFERENCE TO RELATED APPLICATIONS

The present application is a U.S. National Stage Entry of International Application No. PCT/JP2011/073881, filed 10 Oct. 2011, which claims priority benefit from Japanese Patent Application No. 2010-247531, filed 4 Nov. 2010, all of which are incorporated by reference herein in their entirety.

TECHNICAL FIELD

The present invention relates to an organic electroluminescent device (hereinafter may be referred to as "organic EL device" and "organic electroluminescence device").

BACKGROUND ART

Organic electroluminescent devices are self-emission type display devices and are expected for use in displays and lights. Organic electroluminescent displays have advantageous display performances such as higher visibility than conventional CRTs and LCDs, and no viewing angle dependency. Organic electroluminescent displays also have an advantage that they can be made lighter and thinner. Meanwhile, organic electroluminescent lights can be advantageously lighter and thinner and also, using a flexible substrate, organic electroluminescent lights may have a shape conventional lights cannot have.

An organic electroluminescent layer of an organic electroluminescent device has a multi-layered structure containing a light-emitting layer, a transparent electrode and other layers. Therefore, when light is emitted at an angle equal to or higher than a critical angle determined based on the refractive index of the organic electroluminescent layer and the refractive index of a medium into which the light is to be emitted, the light cannot be emitted to the air, totally reflected, and confined in the interior of the organic electroluminescent layer, so that the light is lost. According to calculation based on the classical Snell's law of refraction, when the refractive index n of the organic electroluminescent layer is 1.8 (the refractive index n of the organic electroluminescent layer is 1.7 to 1.85 according to NPL 1) and the distribution of light emitted from the organic electroluminescent layer is a Lambertian distribution, the light extraction efficiency of the light emitted to the air is only about 30% due to the difference between the refractive index of the organic electroluminescent layer and the refractive index of the air. The remaining light accounting for about 70% cannot be emitted to the air since it is confined in the interior of the organic electroluminescent layer due to this difference in refractive index.

Solving the above problems to improve the light extraction efficiency requires preventing reflection occurring between the organic electroluminescent layer and the air due to the difference between their refractive indices, in particular, preventing the occurrence of total reflection. Provision of a fine particle layer serving as a light extraction layer is one effective method for preventing the occurrence of total reflection, and there have been various proposals of providing the fine particle layer for changing the angle of light emitted from the organic electroluminescent layer.

For example, PTL 1 proposes an organic electroluminescence element containing a high-refractive-index substrate and a fine particle layer on a surface from which light is to be extracted. PTL 1 uses a reflective electrode of MgAg. In this proposal, however, light emitted from an organic electroluminescent layer is scattered by the fine particle layer, and some components are emitted to the air and other components are reflected into the organic electroluminescent layer as a result of back scattering. Extraction of the back-scattered components depends on the reflectivity of a reflective electrode, and the reflective electrode of MgAg is inferior to a reflective electrode of Ag in terms of reflectivity, which is problematic. In addition, since the light emitted from the organic electroluminescent layer travels at all angles, when the light travels in the thickness direction and reflected, scattered and totally reflected, the light hits the wall surfaces of the organic electroluminescent layer and is lost, which is also problematic.

Also, PTL 2 describes that the refractive index of a polymer in a fine particle layer is 0.9 times or more the refractive index of an organic electroluminescent layer. However, in this proposal, the refractive index of the polymer in the fine particle layer is 0.9 times the refractive index of the organic electroluminescent layer. When the distribution of light emitted from the organic electroluminescent layer is a Lambertian distribution, about 15% of the light cannot enter the fine particle layer. Thus, this proposal is unsatisfactory for making improvement in light extraction efficiency.

Moreover, PTL 3 proposes an organic EL device where a light-scattering portion is formed of opaque particles or transparent substances arranged on one plane thereof in a state of being dispersed or aggregated. This proposal, however, does not clearly describe the refractive index of the polymer in the fine particle layer, and when it is lower than the refractive index of the organic electroluminescent layer, total reflection occurs so that the light emitted from the organic electroluminescent layer cannot enter the fine particle layer. Thus, this proposal is unsatisfactory for making improvement in light extraction efficiency.

CITATION LIST

Patent Literature

PTL 1: Japanese Patent Application Laid-Open (JP-A) No. 2004-296429
PTL 2: JP-A No. 2004-127942
PTL 3: JP-A No. 08-83688

Non-Patent Literature

NPL 1: PIONEER R&D Vol. 11 No. 1, pp. 21-28

SUMMARY OF INVENTION

Technical Problem

The present invention aims to solve the above problems in the art and achieve the following object. That is, an object of the present invention is to provide an organic electroluminescent device excellent in external extraction efficiency of emitted light and able to achieve reduced consumption power and long service life.

Solution to Problem

The present inventors conducted extensive studies to solve the above problems and have found (1) when the refractive index of a polymer of a fine particle layer serving as a light extraction layer is set to be equal to or greater than the refractive index of an organic electroluminescent layer, an Ag reflective electrode allows the fine particle layer to sufficiently exhibit its effects, so that total reflection can be avoided, (2) it is possible to suppress reflection between the fine particle layer and the air by utilizing a reflective electrode having an increased reflectivity and a transparent substrate having a refractive index lower than the refractive index of the organic electroluminescent layer, and (3) it is possible to reduce the loss of emitted light by providing a non-light-emitting region on a light-emitting surface of an organic electroluminescent layer; i.e., by satisfying a ratio (w/d) of 9 or more where "d" denotes a total average thickness from the organic electroluminescent layer to the transparent substrate and "w" denotes a minimum width of the non-light-emitting region present outside of the outer periphery of an effective light-emitting region in the organic electroluminescent layer. The present inventors have also found that a remarkable improvement in light extraction efficiency can be made on the basis of the above findings (1) to (3).

The present invention is based on the above finding obtained by the present inventors, and means for solving the above problems are as follows.

<1> An organic electroluminescent device including, in an order mentioned:
  a reflective electrode;
  an organic electroluminescent layer;
  a light extraction layer; and
  a transparent substrate,
wherein a ratio (w/d) is 9 or more where "d" denotes a total average thickness from the organic electroluminescent layer to the transparent substrate and "w" denotes a minimum width of a non-light-emitting region present outside of an outer periphery of an effective light-emitting region in the organic electroluminescent layer.

<2> The organic electroluminescent device according to <1>, wherein the total average thickness "d" from the organic electroluminescent layer to the transparent substrate is a total average thickness of the organic electroluminescent layer, the light extraction layer and the transparent substrate.

<3> The organic electroluminescent device according to <1> or <2>, wherein light emitted from the organic electroluminescent layer is emitted from the transparent substrate.

<4> The organic electroluminescent device according to any one of <1> to <3>, wherein the reflective electrode is made of Ag.

<5> The organic electroluminescent device according to any one of <1> to <4>, wherein a refractive index of the transparent substrate is lower than a refractive index of the organic electroluminescent layer.

<6> The organic electroluminescent device according to any one of <1> to <5>, wherein the light extraction layer is a fine particle layer containing a polymer and fine particles.

<7> The organic electroluminescent device according to <6>, wherein a refractive index of the polymer in the fine particle layer is different from a refractive index of the fine particles.

<8> The organic electroluminescent device according to <6> or <7>, wherein a refractive index of the polymer in the fine particle layer is equal to or higher than the refractive index of the organic electroluminescent layer.

<9> The organic electroluminescent device according to any one of <6> to <8>, wherein the fine particles have an average particle diameter of 0.5 μm to 10 μm.

<10> The organic electroluminescent device according to any one of <6> to <9>, wherein a filling rate by volume of the fine particles in the fine particle layer is 20% to 70%.

<11> The organic electroluminescent device according to any one of <6> to <10>, wherein the fine particle layer has an average thickness of 5 μm to 200 μm.

In the present invention, in order to attain higher light extraction efficiency, studies have been made on the propagation of light and the structure of an organic electroluminescent device having a fine particle layer as a light extraction layer in the process that light emitted from the organic electroluminescent device propagates to the air.

First, consideration is made on the propagation of light. There are the following three factors for sufficiently improving light extraction efficiency: (1) light emitted from an organic electroluminescent layer enters a polymer in a fine particle layer in the maximum amount, and can interact with scattering fine particles; (2) the fine particle layer can sufficiently exhibit its effects; and (3) light scattered by the fine particle layer can be emitted to the air in the maximum amount. Unless all the above three factors are satisfied, it is not assumed that light extraction efficiency can sufficiently be improved.

First, a condition for satisfying the above factor (1); i.e., light emitted from an organic electroluminescent layer enters a polymer in a fine particle layer in the maximum amount, is that the laminated structure from the organic electroluminescent layer to the fine particle layer does not cause reflection or total reflection, at least, so that the light can enter the polymer in the fine particle layer. In order to satisfy these conditions, the following relationship has to be satisfied. Specifically, when the light emitted from the organic electroluminescent layer propagates in an organic electroluminescent device and enters the fine particle layer, the refractive index of each layer of the laminated structure containing the polymer in the fine particle layer is no lower than the refractive index of the organic electroluminescent layer. In other words, the refractive index of each layer of the laminated structure containing the polymer in the fine particle layer is higher than the refractive index of the organic electroluminescent layer.

In general, a transparent electrode is made of indium tin oxide (ITO) (refractive index (n)=2.0), indium zinc oxide (IZO), ZnO (refractive index (n)=1.95), $SnO_2$ (refractive index (n)=2.0), $In_2O_3$ (refractive index (n)=1.9 to 2.0) or $TiO_2$ (refractive index (n)=1.90). The refractive index of an organic electroluminescent layer is 1.75 to 1.8. Hence, in order for the light emitted from the organic electroluminescent layer to enter the polymer in the fine particle layer in the maximum amount, it is necessary that the refractive index of the polymer in the fine particle layer is equal to or higher than that of the organic electroluminescent layer. Needless to say, when a light-permeable layer is present between the fine particle layer and the transparent electrode, the refractive index of the light-permeable layer has to be higher than that of the organic electroluminescent layer.

Next, there are two different conditions for satisfying the above factor (2); i.e., the fine particle layer can sufficiently exhibit its effects. One of these conditions is a condition for optimizing the fine particle layer. When light hits fine particles at a certain angle, the light is scattered in all directions with a certain angle distribution.

This scattering pattern depends on the average particle diameter of the fine particles, the difference in refractive index between fine particles and polymer, and the filling rate by volume of fine particles. Thus, it is necessary to set the optimal condition of the fine particles for increasing light emitted to the air. Also, since light emitted from the organic electroluminescent layer contains light components in all directions, and the light components are scattered in all directions at a certain probability, some light components are scattered towards the interior of the organic electroluminescent device even by optimizing the scattering pattern. Thus, conceivably, the more the opportunities in which the light emitted from the organic electroluminescent layer hits the fine particle layer, the more the light which can be emitted to the air. A condition under which the light scattered to the interior of the organic electroluminescent device returns to the fine particle layer again requires that the reflectivity of a reflective electrode of the organic electroluminescent device be high.

Next, a condition for the above factor (3); i.e., light scattered by the fine particle layer can be emitted to the air in the maximum amount, is that the difference in refractive index between the fine particle layer and the air is small.

By optimizing the configuration of the fine particle layer and using a reflective electrode having a high reflectivity, light emitted from the organic electroluminescent layer can be scattered by the fine particles in the fine particle layer, making it possible to maximize light components having such an angle that they can be emitted to the air. However, when these light components are emitted from the fine particle layer to the air, Fresnel reflection occurs due to the difference in refractive index between the fine particle layer and the air. As a result, the light returns to the fine particle layer and the interior of the organic electroluminescent layer, so that some light components cannot be emitted to the air. In order to reduce such Fresnel reflection, it is effective to decrease the difference in refractive index between the fine particle layer and the air. Accordingly, it is necessary that the refractive index of the transparent substrate is lower than the refractive index of the polymer in the fine particle layer.

However, even after taking the above measures, there may be cases where light extraction efficiency cannot be improved unless a proper relationship is established between the distance from the light-emitting surface of the organic electroluminescent layer to the air surface and the distance from the light-emitted portion to the wall of the device.

Here, another important factor having an effect on the light extraction efficiency of the organic electroluminescent device is to increase, in light emitted from the organic electroluminescent layer, an amount of light that can be propagated to the contact surface of the organic electroluminescent device with the air. Among the light emitted from the organic electroluminescent layer containing light components emitted in all directions, some light components emitted at greater than a certain high angle from the light-emitted portion at the side of the device's wall in the light-emitting surface of the organic electroluminescent layer hit the wall of the organic electroluminescent device before traveling to the contact surface of the organic electroluminescent device with the air, so that these light components are lost. The effect of the lost light on the light extraction efficiency depends on the distance between the light-emitted portion and the contact surface of the light-emitting surface of the organic electroluminescent device with the air. The smaller the distance between the light-emitted portion and the device's wall as well as the distance between the light-emitted portion and the contact surface of the light-emitting surface of the organic electroluminescent device with the air are, the greater the lost light. This is because light components emitted at lower angles cannot travel to the contact surface with the air.

When the refractive index of the organic electroluminescent layer is, for example, 1.8 in the absence of the light extraction layer, the largest angle of light able to be emitted to the air is about 33°. Even if the light emitted at higher angles than 33° is lost, the final light extraction efficiency is not affected. Meanwhile, in the presence of, for example, the fine particle layer serving as the light extraction layer, the following structure is basically necessary. It is specifically such that light having larger angles than the critical angle of total reflection can be made to travel to the light-extraction surface, and the light scattered by the fine particle layer to the interior of the organic electroluminescent device can be reflected by a reflective electrode and enter the fine particle layer again. Thus, the loss of the light emitted at higher angles than 33° has to be minimized. In order to avoid the loss of this light and reduce consumption current, it is effective to provide a non-light-emitting region on the light-emitting surface of the organic electroluminescent layer; i.e., by satisfying a ratio (w/d) of 9 or more where "d" denotes a total average thickness from the organic electroluminescent layer to the transparent substrate and "w" denotes a minimum width of the non-light-emitting region present outside of the outer periphery of an effective light-emitting region in the organic electroluminescent layer.

Accordingly, the following are effective: forming a basic structure where a non-light-emitting region is provided on the light-emitting surface of an organic electroluminescent layer; employing a fine particle layer as a light extraction layer; making the refractive index of a polymer in the fine particle layer equal to or higher than that of the organic electroluminescent layer; optimizing the fine particle layer; employing a reflective electrode having an increased reflectivity; and making the refractive index of a transparent substrate equal to or lower than that of the organic electroluminescent layer. By satisfying these conditions, it is possible to provide an organic electroluminescent device excellent in light extraction efficiency and having reduced power consumption and long service life.

Advantageous Effects of Invention

The present invention can provide an organic electroluminescent device excellent in external extraction efficiency of emitted light and able to achieve reduced consumption power and long service life. The organic electroluminescent device can solve the above existing problems in the art.

DESCRIPTION OF EMBODIMENTS

Figure 1:
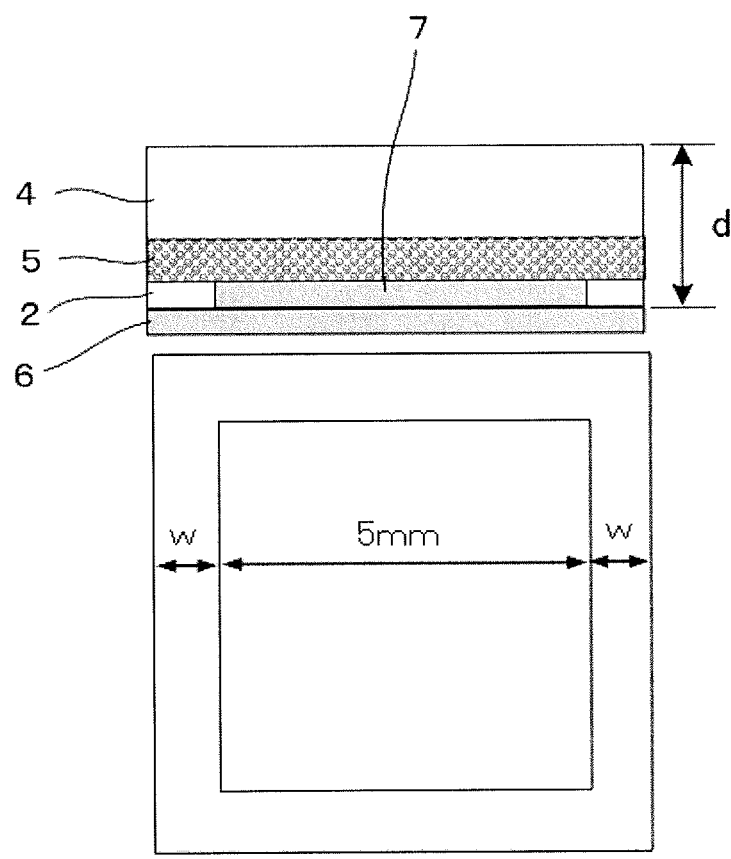
FIG. 1 is a schematic view of a simulation model used in Simulation 1 of Example 1.

An organic electroluminescent device of the present invention contains at least a reflective electrode, an organic electroluminescent layer, a light extraction layer and a transparent substrate in the order mentioned; and, if necessary, further contains other members.

The organic electroluminescent device is preferably of a bottom-emission type in which light emitted from the organic electroluminescent layer is emitted from the transparent substrate. In the case of the organic electroluminescent device of a top-emission type, materials for forming the device have to be transparent in the visible light region (wavelength range: 400 nm to 700 nm) in order for light emitted from the organic electroluminescent layer to transmit therethrough. In the case of the organic electroluminescent device of a bottom-emission type, transparency of the materials for forming the device is not particularly required, and the following materials can widely be used: organic compounds such as silicone polymers, epoxy polymers, acryl polymers and urethane polymers; and inorganic compounds such as SiNx, SiON, $SiO_2$, $Al_2O_3$ and $TiO_2$. From the viewpoints of selectivity and cost of materials for forming the device, a bottom-emission type is preferred.

In the present invention, the ratio (w/d), where "d" denotes a total average thickness from the organic electroluminescent layer to the transparent substrate and "w" denotes a minimum width of a non-light-emitting region present outside of an outer periphery of an effective light-emitting region in the organic electroluminescent layer, is 9 or more, preferably 20 or more. The ratio (w/d) is more preferably 40 or more since the light extraction efficiency obtainable can be made higher. In this manner, by adjusting the ratio (w/d) to be 9 or more; i.e., by making the surface area of the effective light-emitting region in the organic electroluminescent layer so as to be smaller than the surface area of each of the other layers, the loss of the emitted light can be reduced, so that the light extraction efficiency can be improved. When the ratio (w/d) is less than 9, the light extraction efficiency becomes lower than 0.8 times the maximum light extraction efficiency, so that sufficient light extraction efficiency cannot be obtained in some cases.

The total average thickness "d" from the organic electroluminescent layer to the transparent substrate is preferably a total average thickness of the organic electroluminescent layer, the light extraction layer and the transparent substrate.

Here, the effective light-emitting region in the organic electroluminescent layer refers to a region in the organic electroluminescent layer where light is emitted actually.

The total average thickness "d" from the organic electroluminescent layer to the transparent substrate is preferably 200 µm to 1,500 µm, more preferably 500 µm to 1,000 µM.

The minimum width "w" of the non-light-emitting region present outside of the outer periphery of the effective light-emitting region in the organic electroluminescent layer is preferably 0.5 mm to 50 mm, more preferably 2 mm to 30 mm.

<Reflective Electrode>

The reflective electrode is an electrode disposed on the opposite side to the side where light is extracted. The reflective electrode has a function of reflecting light emitted from the organic electroluminescent layer.

As a material for the reflective electrode, silver (Ag) is suitably used from the viewpoint of reflectivity. When other metals than silver (Ag) such as MgAg and Al are used for the reflective electrode, there may be a case where light extraction efficiency cannot be improved. When the reflective electrode is made of silver (Ag), there may be an Al or LiF layer having an optically negligible thickness (10 nm or smaller) between the reflective electrode and an electron transport layer in order to improve electrical properties.

The reflective electrode is formed by, for example, a vacuum vapor deposition method, an electron beam method, a sputtering method, a resistance heating evaporation method or a coating method.

The thickness of the reflective electrode is not particularly limited and may be appropriately selected depending on the intended purpose, but is preferably 10 nm to 5 µm, more preferably 50 nm to 1 µm, further preferably 100 nm to 1 µm.

<Transparent Substrate>

The refractive index of the transparent substrate is preferably lower than the refractive index of the organic electroluminescent layer (i.e., the refractive index of the polymer in the fine particle layer). In addition, the refractive index of the transparent substrate is preferably lower than the refractive index of the polymer in the fine particle layer, which is equal to the refractive index of the organic electroluminescent layer. When the refractive index of the transparent substrate is higher than the refractive index of the organic electroluminescent layer, light emitted from the organic electroluminescent layer is reflected between the transparent substrate and the reflective electrode. As the emitted light travels therebetween, some components thereof are absorbed and lost in the organic electroluminescent layer and the reflective electrode, leading to a drop in light extraction efficiency.

The refractive index of the transparent substrate is not particularly limited and may be appropriately selected depending on the intended purpose so long as it is lower than the refractive index of the organic electroluminescent layer. For example, in the case of glass, the refractive index thereof is preferably 1.4 to 1.8.

The shape, structure, size, etc. of the transparent substrate are not particularly limited and may be appropriately selected. In general, the shape of the transparent substrate is preferably a sheet. The structure of the transparent substrate may be a single-layered structure or a multi-layered structure, and may be a single member or a combination of two or more members. The transparent substrate may be colorless transparent or colored transparent. Preferably, the transparent substrate is colorless transparent since light emitted from the organic electroluminescent layer is not scattered or attenuated.

A material for the substrate is not particularly limited and may be appropriately selected depending on the intended purpose. Examples thereof include: inorganic materials such as yttria-stabilized zirconia (YSZ) and glass; and organic materials such as polyester resins (e.g., polyethylene terephthalate resins, polybutylene phthalate resins and polyethylene naphthalate resins), polystyrene resins, polycarbonate resins, polyether sulfone resins, polyarylate resins, polyimide resins, polycycloolefin resins, norbornene resins and poly(chlorotrifluoroethylene) resins. These may be used alone or in combination.

When glass is used for the substrate, the glass used is preferably alkali-free glass for reducing ions eluted from glass. When soda-lime glass is used for the substrate, the soda-lime glass used is preferably provided with a barrier coat of, for example, silica (e.g., a barrier film substrate). When organic materials are used for the substrate, the organic materials used are preferably excellent in heat resistance, dimensional stability, solvent resistance, electrical insulating property and processability.

When a thermoplastic substrate is used, the thermoplastic substrate may further be provided with, for example, a hard coat layer and an under coat layer, if necessary.

Among them, the material for the substrate is particularly preferably transparent glass, quartz, sapphire, and transparent synthetic resins such as polyesters, polyacrylates, polycarbonates and polyether ketones.

The thickness of the transparent substrate is not particularly limited and may be appropriately selected depending on the intended purpose so long as it is enough to keep its mechanical strength. When glass is used for the transparent substrate, the thickness of the transparent substrate is preferably 0.2 mm or greater, more preferably 0.7 mm or greater.

<Light Extraction Layer>

The light extraction layer is not particularly limited and may be appropriately selected depending on the intended purpose so long as it has a function of extracting light. The light extraction layer is preferably a fine particle layer.

The fine particle layer contains at least a polymer and fine particles; and, if necessary, further contains other ingredients.

The refractive index of the polymer in the fine particle layer is preferably different from the refractive index of the fine particles.

In the case where the polymer whose refractive index is equal to or higher than the refractive index of the organic electroluminescent layer contains the fine particles whose refractive index is different from the refractive index of the polymer, every time light emitted toward the polymer from the organic electroluminescent layer hits the fine particles, the light is scattered due to the difference in refractive index between the polymer and the fine particles, so that the angle of the emitted light is changed. In this manner, when to-be-totally-reflected light emitted at higher angles are changed to light emitted at lower angles, the light is emitted to the air from the transparent substrate. Also, the light emitted at higher angles is scattered toward the reflective electrode, reflected on the reflective electrode, and again enters the fine particle layer, where the angle of the emitted light is changed. Thus, it is preferable for the polymer to contain the fine particles whose refractive index is different from the polymer, from the viewpoint of improving the light extraction efficiency of the organic electroluminescent device.

—Fine Particles—

The fine particles are not particularly limited and may be appropriately selected depending on the intended purpose so long as they have a refractive index different from that of the polymer in the fine particle layer and can scatter light. The fine particles may be organic fine particles or inorganic fine particles. Preferably, two or more kinds of fine particles are contained in the fine particle layer.

Examples of the organic fine particles include polymethyl methacrylate beads, acryl-styrene copolymer beads, melamine beads, polycarbonate beads, polystyrene beads, crosslinked polystyrene beads, polyvinyl chloride beads and benzoguanamine.melamineformaldehyde beads.

Examples of the inorganic fine particles include $ZrO_2$, $TiO_2$, $Al_2O_3$, $In_2O_3$, $ZnO$, $SnO_2$ and $Sb_2O_3$. Among them, $TiO_2$, $ZrO_2$, $ZnO$ and $SnO_2$ are particularly preferred.

The refractive index of the fine particles is not particularly limited and may be appropriately selected depending on the intended purpose so long as it is different from the refractive index of the polymer in the fine particle layer. The refractive index of the fine particles is preferably 1.55 to 2.6, more preferably 1.58 to 2.1.

The refractive index of the fine particles can be measured in the following manner, for example. Specifically, an automated refractive index meter (KPR-2000, product of Shimadzu Corporation Ltd.) is used to measure the refractive index of a refractive index liquid, followed by measuring with a precision spectrometer (GMR-1DA, product of Shimadzu Corporation Ltd.) by the Shrivsky method.

The average particle diameter of the fine particles is preferably 0.5 μm to 10 μm, more preferably 0.5 μm to 6 μm. When the average particle diameter of the fine particles is more than 10 μm, such fine particles scatter most of light forward, so that they may be degraded in an ability to change the angle of light. Although light emitted at higher angles is returned to the organic electroluminescent layer, reflected on the reflective electrode, and again enters the fine particle layer as described above, there may be a drop in light extraction efficiency due to the finite size of the organic electroluminescent device and to the absorption into the organic electroluminescent layer and the reflective electrode. Whereas when the average particle diameter of the fine particles is less than 0.5 μm, the average particle diameter thereof is less than the wavelengths of visible light and Mie scattering is changed to Rayleigh scattering, which increases the wavelength dependency of scattering efficiency of the fine particles to presumably cause a great change in chromaticity of the light-emitting element and a drop in light extraction efficiency.

The average particle diameter of the fine particles can be measured by, for example, a device using the dynamic light scattering method such as NANOTRACK UPA-EX150 (product of NIKKISO CO., LTD.) or image processing of their electron microscope image.

The filling rate by volume of the fine particles in the fine particle layer is preferably 20% to 70%, more preferably 30% to 65%. When the filling rate by volume thereof is less than 20%, there is low probability that the fine particles scatter light entering the fine particle layer, so that the fine particle layer has a low ability to change the angle of light. Thus, unless the thickness of the fine particle layer is sufficiently increased, there may be a drop in light extraction efficiency. Increasing the thickness of the fine particle layer may unfavorably lead to elevation of cost. In addition, back-scattered light increases to lead to a drop in light extraction efficiency. Whereas when the filling rate by volume thereof is more than 70%, the resultant state is almost the closest packing state, potentially making it difficult to control properties of the fine particle layer.

The filling rate by volume of the fine particles in the fine particle layer can be measured by, for example, a weight measuring method. First, the fine particles are measured for specific gravity using a particle specific gravity meter (MARK3, product of UNION ENGINERRING CO., LTD.) and then an electric balance (FZ-3000i, product of A&D Company, Ltd.) is used to measure the weight of the fine particles. Next, a part of the fine particle layer is cut out and the resultant cut section is observed under a scanning electron microscope (S-3400N, product of Hitachi High-Technologies Corporation) to measure the thickness of the fine particle layer. In this manner, the filling rate by volume of the fine particles in the fine particle layer can be determined.

<<Polymer>>

As described above, the refractive index of the polymer in the fine particle layer is equal to or higher than the refractive index of the organic electroluminescent layer and is preferably 1.55 to 1.95.

Such high-refractive-index polymers suitably used are high-refractive-index compositions in which the polymer is adjusted to exhibit a high refractive index using high-refractive-index fine particles having small particle diameters.

The high-refractive-index composition contains: the above fine particles; high-refractive-index fine particles having small particle diameters; and a matrix. If necessary, the high-refractive-index composition further contains a dispersing agent, a solvent, and other ingredients.

—High-Refractive-Index Fine Particles—

The refractive index of the high-refractive-index fine particles is preferably 1.8 to 2.8, more preferably 1.9 to 2.8. The average particle diameter of primary particles of the high-refractive-index fine particles is preferably 3 nm to 100 nm, more preferably 5 nm to 100 nm, still more preferably 10 nm to 80 nm.

When the refractive index of the high-refractive-index fine particles is 1.8 or higher, the refractive index of the fine particle layer can be increased effectively. When the refractive index of the high-refractive-index fine particles is 2.8 or lower, such high-refractive-index fine particles do not cause any inconveniences such as coloring of the particles, which is preferred. When the average particle diameter of primary particles of the high-refractive-index fine particles is 100 nm or less, such high-refractive-index fine particles do not cause any inconveniences such as impairment of transparency of the formed fine particle layer due to an increased haze thereof. When the average particle diameter of primary particles of the high-refractive-index fine particles is 3 nm or more, the refractive index is preferably kept high.

The particle diameter of the high-refractive-index fine particles is expressed by an average primary particle diameter measured using a transmission electron microscope (TEM) image. The average primary particle diameter is expressed by an average of the maximum diameters of the fine particles. When each fine particle has a long-axis diameter and a short-axis diameter, the average primary particle diameter is expressed by an average of the long-axis diameters of the fine particles.

Examples of the high-refractive-index fine particles include particles containing as a main ingredient an oxide, a composite oxide or a sulfide of, for example, Ti, Zr, Ta, In, Nd, Sn, Sb, Zn, La, W, Ce, Nb, V, Sm and/or Y. Here, the main ingredient means an ingredient present in the largest amount (% by mass) among the constituent ingredients of the particles. More preferred high-refractive-index fine particles are particles containing as a main ingredient an oxide or a composite oxide containing at least one metal element selected from Ti, Zr, Ta, In and Sn.

The high-refractive-index fine particles may contain various elements therein (hereinafter such elements may be referred to as "contained elements").

Examples of the contained elements include Li, Si, Al, B, Ba, Co, Fe, Hg, Ag, Pt, Au, Cr, Bi, P and S. When tin oxide particles or indium oxide particles are used, it is preferable to incorporate the contained particles such as Sb, Nb, P, B, In, V and halogen atoms, in order to increase electrical conductivity of the particles. It is most preferable to incorporate antimony oxide in an amount of 5% by mass to 20% by mass.

Further examples of the high-refractive-index fine particles include inorganic fine particles containing titanium dioxide as a main ingredient and at least one element selected from Co, Zr and Al as a contained element (hereinafter such inorganic fine particles may be referred to as "specific oxide"). Among these contained elements, Co is particularly preferred.

The total amount of the Co, Al and Zr is preferably 0.05% by mass to 30% by mass, more preferably 0.1% by mass to 10% by mass, further preferably 0.2% by mass to 7% by mass, particularly preferably 0.3% by mass to 5% by mass, most preferably 0.5% by mass to 3% by mass, relative to the amount of Ti.

The contained elements Co, Al and Zr are present in the interior or the surface of the high-refractive-index fine particles containing titanium dioxide as a main ingredient. Preferably, they are present in the interior of the high-refractive-index fine particles containing titanium dioxide as a main ingredient. More preferably, they are present in both the interior and the surface thereof. Metal elements among these contained elements may exist in the form of oxides thereof.

Other preferred high-refractive-index fine particles are, for example, inorganic fine particles which are particles of a composite oxide formed of a titanium element and at least one metal element selected from metal elements whose oxides have a refractive index of 1.95 or higher (hereinafter this metal element may be abbreviated as "Met") where the composite oxide is doped with at least one kind of metal ions selected from Co ions, Zr ions and Al ions (hereinafter this composite oxide may be referred to as "specific composite oxide"). Here, examples of the metal elements whose oxides have a refractive index of 1.95 or higher include Ta, Zr, In, Nd, Sb, Sn and Bi. Among them, Ta, Zr, Sn and Bi are particularly preferred.

The amount of the metal ions with which the specific composite oxide is doped is preferably 25% by mass or less relative to the amount of all the metals forming the composite oxide; i.e., [Ti+Met], from the viewpoint of keeping its refractive index. It is more preferably 0.05% by mass to 10% by mass, further preferably 0.1% by mass to 5% by mass, particularly preferably 0.3% by mass to 3% by mass.

The doped metal ions may be present in the form of metal ions or metal atoms. They may appropriately be present from the surface to the interior of the composite oxide. Preferably, the doped metal ions are present in both the surface and the interior of the composite oxide.

The high-refractive-index fine particles each preferably have a crystalline structure. Preferably, the crystalline structure mainly has a rutile structure, a rutile/anatase mixed crystal, or an anatase structure. Particularly preferably, it mainly has a rutile structure. With this structure, the high-refractive-index fine particles of the specific oxide or the specific composite oxide result to have a refractive index of 1.9 to 2.8, which is preferred. The refractive index thereof is more preferably 2.1 to 2.8, further preferably 2.2 to 2.8. In addition, it is possible to prevent titanium dioxide from exerting its photocatalytic activity, which enables remarkable improvement in weatherability of the fine particle layer itself and of both the above and under layers in contact with the fine particle layer.

A method for doping the above specific metal atoms or metal ions may be a conventionally known method. Examples thereof include: methods described in, for example, JP-A Nos. 05-330825, 11-263620 and 11-512336 and Europe Patent Application No. 0335773; and ion implantation methods [described in, for example, "Ion Beam Applied Technology" edited by Shunichi Gonda, Junzo Ishikawa and Eiji Kamijo and published by CMC Publishing Co., Ltd. in 1989, Yasushi Aoki, "Surface Science" Vol. 18(5), p. 262, 1998, Masakazu Anpo et al., "Surface Science" Vol. 20(2), p. 60, 1999].

The high-refractive-index fine particles may be subjected to a surface treatment. The surface treatment is a treatment with which the surfaces of the particles are modified using an inorganic compound and/or an organic compound. The surface treatment can adjust wettability of the surfaces of the high-refractive-index fine particles to improve fine particle formation in an organic solvent as well as dispersibility and dispersion stability thereof in the high-refractive-index composition. Examples of the inorganic compound to be physicochemically adsorbed on the surfaces of the particles include silicon-containing inorganic compounds (e.g., $SiO_2$), aluminum-containing inorganic compounds [e.g., $Al_2O_3$ and $Al(OH)_3$], cobalt-containing inorganic compounds (e.g., $CoO_2$, $Co_2O_3$ and $Co_3O_4$), zirconium-containing inorganic compounds [e.g., $ZrO_2$ and $Zr(OH)_4$] and iron-containing inorganic compounds (e.g., $Fe_2O_3$).

The organic compound able to be used for the surface treatment may be a conventionally known surface modifying agent of inorganic fillers such as metal oxides and inorganic pigments. They are described in, for example, "Stabilization of Pigment Dispersion and Surface Treatment Technolog.Evaluation," Chapter 1 (published by TECHNICAL INFORMATION INSTITUTE CO., LTD., 2001).

Specific examples of the organic compound used for the surface treatment include: organic compounds containing a polar group having affinity with the surfaces of the high-refractive-index fine particles; and coupling compounds.

Examples of the polar group having affinity with the surfaces of the high-refractive-index fine particles include a carboxyl group, a phosphono group, a hydroxyl group, a mercapto group, cyclic acid anhydride groups and an amino group. The organic compounds are preferably compounds containing at least one kind of these groups in the molecules thereof. Examples of such compounds include long-chain aliphatic carboxylic acids (e.g., stearic acid, lauric acid, oleic acid, linoleic acid and linolenic acid) and polyol compounds (e.g., pentaerythritol triacrylate, dipentaerythritol pentaacrylate and ECH (epichlorohydrin)-modified glycerol triacrylate), phosphono group-containing compounds (e.g., EO (ethylene oxide)-modified phosphoric acid triacrylate) and alkanolamines (ethylene diamine EO adducts (5 mole)).

Examples of the coupling compounds include conventionally known organic metal compounds, including silane coupling agents, titanate coupling agents and aluminate coupling agents. Among them, silane coupling agents are particularly preferred. Specific examples thereof include compounds described in JP-A No. 2002-9908 and paragraphs [0011] to [0015] of JP-A No. 2001-310423. Two or more kinds of these compounds used for the surface treatment may be used in combination.

The high-refractive-index fine particles are also preferably fine particles having core-shell structures where the high-refractive-index fine particles serving as cores are provided with shells of another inorganic compound. The shell is preferably made of an oxide of at least one element selected from Al, Si and Zr. Specific examples thereof are described in, for example, JP-A No. 2001-166104.

The shape of each of the high-refractive-index fine particles is not particularly limited and may be appropriately selected depending on the intended purpose. For example, it is preferably a rice shape, a spherical shape, a cubic shape, a spindle shape or an amorphous shape. Only one kind of the high-refractive-index fine particles may be used, or two or more kinds thereof may be used in combination.

The amount of the high-refractive-index fine particles is not particularly limited and may be appropriately selected depending on the intended purpose, but preferably falls within such a range that can make the refractive index of the polymer to be 1.55 to 1.95.

The matrix is preferably (A) an organic binder, (B) an organic metal compound containing a hydrolyzable functional group and a partially condensated product of the organic metal compound, or both of (A) and (B).

—(A) Organic Binder—

Examples of the (A) organic binder include binders formed from (1) conventionally known thermoplastic resins, (2) combinations of conventionally known reactive curable resins and curing agents, or (3) combinations of binder precursors (e.g., the below-described curable polyfunctional monomers or oligomers) and polymerization initiators.

The high-refractive-index composition is preferably prepared from a dispersion liquid containing: the organic binder formed from the above (1), (2) or (3); fine particles; and a dispersing agent. This composition is coated on a support and formed into a film, which is then cured by a method selected depending on the ingredient for forming the binder, to thereby form the fine particle layer. A method for curing the film may be appropriately selected depending on the kind of the ingredient for forming the binder, and examples thereof include a method of inducing crosslinking or polymerization reaction of curable compounds (e.g., polyfunctional monomers or oligomers) by means of heating, light application, or both thereof. Among them, preferred is a method where light is applied to the combinations in (3)

above to allow the curable compounds to perform crosslinking or polymerization reaction so that the binder is formed.

Furthermore, it is preferable to allow the dispersing agent contained in the dispersion liquid of the fine particles to perform crosslinking or polymerization reaction simultaneously with or after coating of the high-refractive-index composition.

The binder in the thus-cured film is, for example, in a state where the binder incorporates an anionic group of the dispersing agent as a result of crosslinking or polymerization reaction of the dispersing agent and the curable polyfunctional monomer or oligomer, which is a precursor of the binder. Furthermore, the anionic group of the binder in the cured film has a function of keeping the dispersion state of the high-refractive-index fine particles. The crosslinked or polymerized structure provides the binder with an ability to form a film, enabling improvement in physical strength, resistance to chemicals, and weatherabilty of the cured film containing the high-refractive-index fine particles.

{Thermoplastic Resin (A-1)}

The thermoplastic resins in (1) above are not particularly limited and may be appropriately selected depending on the intended purpose. Examples thereof include polystyrene resins, polyester resins, cellulose resins, polyether resins, vinyl chloride resins, vinyl acetate resins, vinyl chloride-vinyl acetate copolymer resins, polyacryl resins, polymethacryl resins, polyolefin resins, urethane resin, silicone resins and imide resins.

{Combinations of Reactive Curable Resins and Curing Agents (A-2)}

As the reactive curable resins in (2) above, thermosetting resins and/or ionizing radiation-curable resins are preferably used.

The thermosetting resins are not particularly limited and may be appropriately selected depending on the intended purpose. Examples thereof include phenol resins, urea resins, diallylphthalate resins, melamine resins, guanamine resins, unsaturated polyester resins, polyurethane resins, epoxy resins, aminoalkyd resins, melamine-urea co-condensated resins, silicon resins and polysiloxane resins.

The ionizing radiation-curable resins are not particularly limited and may be appropriately selected depending on the intended purpose. Examples thereof include resins containing as a functional group a radical polymerizable unsaturated group (e.g., a (meth)acryloyloxy group, a vinyloxy group, a styryl group and a vinyl group) and/or a cationic polymerizable group (e.g., an epoxy group, a thioepoxy group, a vinyloxy group and an oxetanyl group). Examples of such resins include relatively low-molecular-weight polyester resins, polyether resins, (meth)acryl resins, epoxy resins, urethane resins, alkyd resins, spiroacetal resins, polybutadiene resins and polythiolpolyene resins.

If necessary, the following conventionally known compounds are added to these reactive curable resins in use: curing agents such as crosslinking agents (e.g., epoxy compounds, polyisocyanate compounds, polyol compounds, polyamine compounds and melamine compounds) and polymerization initiators (e.g., UV photoinitiators such as azobis compounds, organic peroxy compounds, organic halogen compounds, onium compounds and ketone compounds); and polymerization accelerating agents (e.g., organic metal compounds, acid compounds and basic compounds). Specifically, compounds described in Shinzo Yamashita, Tosuke Kaneko, "Handbook of Crosslinking Agent" (published by TAISEISHA, LTD. in 1981) are exemplified {Combinations of Binder Precursors and Polymerization Initiators (A-3)}

Next will be mainly described a method for forming a cured binder by using the combinations in (3) above to allow the curable compound to perform crosslinking or polymerization reaction through application of light. This method is a preferred method for forming a cured binder.

A functional group of the photocurable polyfunctional monomer or oligomer which is the binder precursor may be any of a radical polymerizable functional group and a cationic polymerizable functional group.

Examples of the radical polymerizable functional group include ethylenically unsaturated groups such as a (meth) acryloyloxy group, a vinyloxy group, a styryl group and an allyl group. Among them, preferred is a (meth)acryloyloxy group. Particularly preferred is a polyfunctional monomer containing two or more radical polymerizable groups in the molecule thereof.

The radical polymerizable functional monomer is preferably selected from compounds having at least two ethylenically unsaturated bonds at the end thereof. Among them, particularly preferred are compounds having two to six ethylenically unsaturated bonds at the end thereof. Such compounds are widely known in the field of polymer materials, and usable compounds are not limited thereto. These can have a chemical form such as a monomer, a prepolymer (i.e., a dimer, a trimer and an oligomer), a mixture thereof or a copolymer thereof.

Examples of the radical polymerizable monomer include unsaturated carboxylic acids (e.g., acrylic acid, methacrylic acid, itaconic acid, crotonic acid, isocrotonic acid and maleic acid), esters thereof and amides thereof. Among them, particularly preferred are esters formed between unsaturated carboxylic acids and aliphatic polyhydric alcohol compounds, and amides formed between unsaturated carboxylic acids and aliphatic polyvalent amine compounds.

In addition, suitably used are addition reaction products formed between unsaturated carboxylic acid esters and amides having a nucleophilic substituent (e.g., a hydroxyl group, an amino group or a mercapto group) and monofunctional or polyfunctional isocyanates or epoxys; and dehydration reaction products formed between unsaturated carboxylic acid esters and amides having a nucleophilic substituent (e.g., a hydroxyl group, an amino group or a mercapto group) and polyfunctional carboxylic acids. Furthermore, suitably used are reaction products formed between (i) unsaturated carboxylic acid esters or amides having an electrophilic substituent (e.g., an isocyanate group or an epoxy group) and (ii) monofunctional or polyfunctional alcohols, amines or thiols. Moreover, usable are compounds that are the same as the above-listed compounds except that the unsaturated carboxylic acids are changed to, for example, unsaturated phosphonic acids or styrene.

Examples of the aliphatic polyhydric alcohol compounds include alkanediols, alkanetriols, cyclohexanediols, cyclohexanetriols, inositol, cyclohexanedimethanol, pentaerythritol, sorbitol, dipentaerythritol, tripentaerythritol, glycerin and diglycerin. Examples of polymerizable ester compounds (monoesters or polyesters) formed between these aliphatic polyhydric alcohol compounds and unsaturated carboxylic acids include compounds described in paragraphs [0026] and [0027] of JP-A No. 2001-139663.

Other polymerizable esters suitably used are, for example, vinyl methacrylate, allyl methacrylate, ally acrylate, aliphatic alcohol esters described in, for example, Japanese Patent Application Publication (JP-B) Nos. 46-27926 and 51-47334 and JP-A No. 57-196231, compounds having an aromatic skeleton described in, for example, JP-A No. $O_2$-226149, and compounds having an amino group described in JP-A No. 01-165613.

Furthermore, examples of polymerizable amides formed between aliphatic polyvalent amine compounds and unsaturated carboxylic acids include methylenebis(meth)acrylamide, 1,6-hexamethylenebis(meth)acrylamide, diethylenetriaminetris(meth)acrylamide, xylylenebis(meth)acrylamide, and compounds having a cyclohexylene structure described in JP-B No. 54-21726.

Moreover, the following compounds may be used: vinylurethane compounds having two or more polymerizable vinyl groups in one molecule thereof (described in, for example, JP-B No. 48-41708), urethane acrylates (described in, for example, JP-B No. 02-16765), urethane compounds having an ethylene oxide skeleton (described in, for example, JP-B No. 62-39418), polyester acrylates (described in, for example, JP-B No. 52-30490), and photocurable monomers and oligomers described in Journal of the Adhesion Society of Japan, Vol. 20, No. 7, pp. 300 to 308 (1984). Two or more kinds of these radical polymerizable polyfunctional monomers may be used in combination.

Next, description will be given to a compound containing a cationic polymerizable group usable for forming the polymer of the fine particle layer (hereinafter this compound may be referred to as "cationic polymerizable compound" or "cationic polymerizable organic compound").

The cationic polymerizable compound may be any compound which causes polymerization reaction and/or cross-linking reaction when irradiated with active energy rays in the presence of a cationic polymerization initiator sensitive to active energy rays. Typical examples thereof include epoxy compounds, cyclic thioether compounds, cyclic ether compounds, spiroorthoester compounds, vinyl hydrocarbon compounds and vinyl ether compounds. These cationic polymerizable organic compounds may be used alone or in combination.

The number of cationic polymerizable groups in one molecule of the cationic polymerizable group-containing compound is preferably 2 to 10, more preferably 2 to 5. The average molecular weight of the cationic polymerizable group-containing compound is preferably 3,000 or lower, more preferably 200 to 2,000, further preferably 400 to 1,500. When the average molecular weight thereof is higher than the above lower limit, such cationic polymerizable group-containing compounds do not cause any inconveniences such as problematic evaporation in the course of the formation of a coating film. When the average molecular weight thereof is lower than the above upper limit, such cationic polymerizable group-containing compounds do not cause any problems such as deteriorated compatibility with the high-refractive-index composition.

Examples of the epoxy compounds include aliphatic epoxy compounds and aromatic epoxy compounds.

Examples of the aliphatic epoxy compounds include: polyglycidyl ethers of aliphatic polyhydric alcohols or alkylene oxide adducts thereof; polyglycidyl esters of aliphatic long-chain polybasic acids; and homopolymers of glycidyl acrylate or glycidyl methacrylate and copolymers of glycidyl acrylate and glycidyl methacrylate. Besides the epoxy compounds, further examples include: monoglycidyl ethers of aliphatic higher alcohols; monoglycidyl esters of higher fatty acids; epoxidized soybean oil; butyl epoxystearate; octyl epoxystearate; epoxidized linseed oil; and epoxidized polybutadiene. Examples of alicyclic epoxy compounds include cyclohexene oxide- or cyclopentene oxide-containing compounds which are obtained by epoxidizing, with an appropriate oxidizing agent such as hydrogen peroxide or a peracid, polyglycidyl esters of polyhydric alcohols containing at least one alicyclic ring or compounds containing an unsaturated alicyclic ring (e.g., cyclohexene, cyclopentene, dicyclooctene or tricyclodecene).

Examples of the aromatic epoxy compounds include monohydric or polyhydric phenols having at least one aromatic nucleus; and monoglycidyl ethers or polyglycidyl ethers of alkylene oxide adducts of the monohydric or polyhydric phenols having at least one aromatic nucleus. Specific examples of these epoxy compounds include: compounds described in paragraphs [0084] to [0086] of JP-A No. 11-242101; and compounds described in paragraphs [0044] to [0046] of JP-A No. 10-158385.

Among these epoxy compounds, considering quick drying property, aromatic epoxides and alicyclic epoxides are preferred, with alicyclic epoxides being more preferred. The epoxy compounds may be used alone, or two or more kinds of the epoxy compounds may be appropriately combined together in use.

Examples of the cyclic thioether compounds include compounds which are the same as the above-listed epoxy compounds except that the epoxy ring is changed to a thioepoxy ring.

Specific examples of oxetanyl group-containing compounds as cyclic ethers include compounds described in paragraphs [0024] and [0025] of JP-A No. 2000-239309. These compounds are preferably used in combination with epoxy-group containing compounds.

Examples of the spiroorthoester compounds include compounds described in JP-A No. 2000-506908.

Examples of the vinyl hydrocarbon compounds include styrene compounds, vinyl group-substituted alicyclic hydrocarbon compounds (e.g., vinyl cyclohexane and vinyl bicycloheptene), the compounds listed above as the radical polymerizable monomer, propenyl compounds {described in, for example, "J. Polymer Science: Part A: Polymer Chemistry," Vol. 32, p. 2895 (1994)}, alcoxy allene compounds {described in, for example, "J. Polymer Science: Part A: Polymer Chemistry," Vol. 33, p. 2493 (1995)}, vinyl compounds {for example, "J. Polymer Science: Part A: Polymer Chemistry," Vol. 34, p. 1015 (1996) and JP-A No. 2002-29162} and isopropenyl compounds {described in, for example, "J. Polymer Science: Part A: Polymer Chemistry," Vol. 34, p. 2051 (1996)}. These may be used alone, or two or more kinds of them may be appropriately combined together in use.

The polyfunctional compound used is preferably a compound containing, in the molecule thereof, at least one selected from the above radical polymerizable groups and cationic polymerizable groups. Examples thereof include: compounds described in paragraphs [0031] to [0052] of JP-A No. 08-277320; and compounds described in paragraph [0015] of JP-A No. 2000-191737. However, compounds used in the present invention are not limited thereto.

The mass ratio of the radical polymerizable compound and the cationic polymerizable compound contained is preferably 90:10 to 20:80, more preferably 80:20 to 30:70, as the radical polymerizable compound:the cationic polymerizable compound.

Next will be described in detail the polymerization initiator used in combination with the binder precursor in the combinations in (3) above.

Examples of the polymerization initiator include thermal polymerization initiators and photopolymerization initiators.

The polymerization initiator is preferably a compound that generates radicals or acids through application of light and/or heat. The maximum absorption wavelength of the photopolymerization initiator is preferably 400 nm or lower. Since it has an absorption wavelength in the ultraviolet region, the photopolymerization initiator can be handled under white light. Alternatively, a compound having the maximum absorption wavelength in the near infrared region can be used.

The above radical-generating compound refers to a compound that generates radicals through application of light and/or heat, to thereby initiate and accelerate polymerization of a compound having a polymerizable unsaturated group. As this compound, a known polymerization initiator or a compound having a bond of low bond-dissociation energy may be appropriately selected for use. The radical-generating compounds may be used alone or in combination.

Examples of the radical-generating compound include: thermal radical polymerization initiators such as organic peroxide compounds and azo polymerization initiators; and photoradical polymerization initiators such as organic peroxide compounds (described in, for example, JP-A No. 2001-139663), amine compounds (described in, for example, JP-B No. 44-20189), metallocene compounds (described in, for example, JP-A Nos. 05-83588 and 01-304453), hexaarylbiimidazole compounds (described in, for example, U.S. Pat. No. 3,479,185), disulfone compounds (described in, for example, JP-A No. 05-239015 and 61-166544), organic halogenated compounds, carbonyl compounds and organic boric-acid compounds.

Examples of the organic halogenated compounds include compounds described in, for example, "Bull. Chem. Soc Japan," Vol. 42, p. 2924 (1969) written by Wakabayashi et al., U.S. Pat. No. 3,905,815, JP-A No. 05-27830, and M. P. Hutt, "J. Heterocyclic Chemistry," Vol. 1 (No. 3), (1970). In particular, examples thereof include oxazole compounds having a trihalomethyl group as a substituent and s-triazine compounds. More suitable examples thereof include s-triazine derivatives where at least one mono-, di- or trihalogen-substituted methyl group is bonded to an s-triazine ring.

Examples of the carbonyl compounds include: compounds described in "Latest UV Curing Technology" pp. 60 to 62 [published by TECHNICAL INFORMATION INSTITUTE CO., LTD., 1991], paragraphs [0015] and [0016] of JP-A No. 08-134404, and paragraphs [0029] to [0031] of JP-A No. 11-217518; and acetophenone compounds, hydroxyacetophenone compounds, benzophenone compounds, thioxane compounds, benzoin compounds (e.g., benzoin ethyl ether and benzoin isobutyl ether), benzoic acid ester derivatives (e.g., ethyl p-dimethylaminobenzoate and ethyl p-diethylaminobenzoate), benzyl dimethyl ketal and acyl phosphine oxide.

Examples of the organic boric-acid compounds include: organic boric-acid compounds described in, for example, Japanese Patent (JP-B) No. 2764769, JP-A No. 2002-116539, and Kunz, Martin, "Rad. Tech '98. Proceeding Apr. 19 to 22, 1998, Chicago." Specifically, compounds described in paragraphs [0022] to [0027] of JP-A No. 2002-116539 are exemplified. Further examples of the organic boric-acid compounds include: organic boron-transition metal coordination complexes described in, for example, JP-A Nos. 06-348011, 07-128785, 07-140589, 07-306527 and 07-292014.

Only one kind of these radical-generating compounds may be added, or two or more kinds thereof may be used in combination.

The amount of the radical-generating compound added is preferably 0.1% by mass to 30% by mass, more preferably 0.5% by mass to 25% by mass, further preferably 1% by mass to 20% by mass, relative to the total amount of the radical polymerizable monomer. When the amount thereof falls within the above range, the high-refractive-index composition is free of problems about stability over time and is highly polymerizable.

Next, a photoacid generator usable as the photopolymerization initiator will be described in detail.

Examples of the photoacid generator include known compounds such as photoinitiators for photocationic polymerization, photodecoloring agents for dyes, photodiscoloring agents, and known photoacid generators used in, for example, microresist; and mixtures thereof. Further examples of the photoacid generator include organic halogenated compounds, disulfone compounds and onium compounds, with organic halogenated compounds and disulfone compounds being particularly preferred. Specific examples of the organic halogenated compounds and disulfone compounds are similar to the compounds described as the radical-generating compounds.

Examples of the onium compounds include diazonium salts, ammonium salts, iminium salts, phosphonium salts, iodonium salts, sulfonium salts, arsonium salts and selenonium salts. Specific examples thereof include compounds described in, for example, paragraphs [0058] and [0059] of JP-A No. 2002-29162.

Onium salts are particularly suitably used as the acid generator. Among them, diazonium salts, iodonium salts, sulfonium salts and iminium salts are particularly preferred from the viewpoints of, for example, photosensitivity for photopolymerization initiation and material stability of compounds.

Examples of the onium salts include: amyl sulfonium salts described in paragraph [0035] of JP-A No. 09-268205; diaryliodonium salts and triarylsulfonium salts described in paragraphs [0010] and [0011] of JP-A No. 2000-71366; sulfonium salts of thiobenzoic acid S-phenyl esters described in paragraph [0017] of JP-A No. 2001-288205; and onium salts described in paragraphs [0030] to [0033] of JP-A No. 2001-133696.

Further examples of the photoacid generator include: organic metal/organic halogenated compounds described in paragraphs [0059] to [0062] of JP-A No. 2002-29162; photoacid generators having an o-nitrobenzyl-type protective group; and compounds that decompose by light to generate sulfonic acid (e.g., imino sulfonate).

Only one kind of these acid generators may be used, or two or more kinds thereof may be used in combination. The amount of the acid generator added is preferably 0.1% by mass to 20% by mass, more preferably 0.5% by mass to 15% by mass, further preferably 1% by mass to 10% by mass, relative to the total mass of all the cationic polymerizable monomers. The amount of the acid generator falling within the above range is preferred from the viewpoints of stability and polymerization reactivity of the high-refractive-index composition.

The high-refractive-index composition preferably contains the radical polymerization initiator in an amount of 0.5% by mass to 10% by mass or the cationic polymerization initiator in an amount of 1% by mass to 10% by mass relative to the total mass of the radical polymerizable compound or the cationic polymerizable compound. More preferably, the high-refractive-index composition contains the radical polymerization initiator in an amount of 1% by mass to 5% by mass or the cationic polymerization initiator in an amount of 2% by mass to 6% by mass relative to the total mass of the radical polymerizable compound or the cationic polymerizable compound When the polymerization reaction is performed through application of ultraviolet rays, a conventionally known ultraviolet ray spectral sensitizer or a chemical sensitizer may further be added to the high-refractive-index composition. Examples of these sensitizers include Michler's ketone, amino acids (e.g., glycine) and organic amines (e.g., butyl amine and dibutyl amine).

When the polymerization reaction is performed through application of near infrared rays, a near infrared spectral sensitizer is preferably used in combination. The near infrared spectral sensitizer used in combination may be a light-absorbing compound having an absorption band in at least a part of the wavelength region of 700 nm or higher, and is preferably a compound having a molecular extinction coefficient of 10,000 or greater. Furthermore, the near infrared spectral sensitizer is preferably a compound exhibiting absorption in the wavelength region of 750 nm to 1,400 nm and having a molecular extinction coefficient of 20,000 or greater. More preferably, the near infrared spectral sensitizer is a compound having a non-absorbing region in the visible light wavelength region of 420 nm to 700 nm and being optically transparent.

The near infrared spectral sensitizer may be various pigments and dyes known as a near infrared absorption pigment and a near infrared absorption dye. Among them, conventionally known near infrared ray absorbers are preferably used. Examples thereof include: commercially available dyes; and known dyes described in literature {e.g., "Near Infrared Absorption Pigment" on pp. 45 to 51, May issue 1986 of "Chemical Industry", 2.3 in Chapter 2 of "Development and Market Trend of Functional Colorant in the 90's" (1990) published by CMC Publishing Co., Ltd., "Special Functional Colorant" [edited by Ikemori and Hashiratani, 1986, published by CMC Publishing Co., Ltd.], J. FABIAN, "Chem. Rev.," Vo. 92, pp. 1197 to 1226 (1992)}, catalog published in 1995 by Nippon Photosensitive Colorant Research Institute, and patent literature and laser colorant catalog and published in 1989 by Exciton Inc.
—(B) Organic Metal Compound Containing a Hydrolyzable Functional Group and a Partially Condensated Product of the Organic Metal Compound—

It is preferably to form as the matrix a cured film from a coating film obtained through sol-gel reaction using the organic metal compound containing a hydrolyzable functional group.

Examples of the organic metal compound include compounds containing metals such as Si, Ti, Zr and Al.

Examples of the hydrolyzable functional group include alkoxy groups, alkoxycarbonyl groups, halogen atoms and a hydroxyl group. Among them, particularly preferred are alkoxy groups such as a methoxy group, an ethoxy group, a propoxy group and a butoxy group. Preferred organic metal compounds are organic silicon compounds represented by the following General Formula (2) and partially condensated products thereof (partial condensates). Note that, the fact that the organic silicon compounds represented by General Formula (2) are easily hydrolyzed and then cause dehydration condensation reaction is a well-known fact.

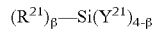 General Formula (2):

In General Formula (2), $R^{21}$ represents a substituted or unsubstituted C1-C30 aliphatic group or C6-C14 aryl group. $Y^{21}$ represents a halogen atom (e.g., a chlorine atom or a bromine atom), a OH group, a $OR^{22}$ group or a $OCOR^{22}$ group, where $R^{22}$ represents a substituted or unsubstituted alkyl group. β is an integer of 0 to 3, preferably 0, 1 or 2, particularly preferably 1. When β is 0, $Y^{21}$ represents a $OR^{22}$ group or a $OCOR^{22}$ group.

In General Formula (2), the aliphatic group represented by $R^{21}$ is preferably a C1-C18 aliphatic group (e.g., methyl, ethyl, propyl, butyl, pentyl, hexyl, octyl, decyl, dodecyl, hexadecyl, octadecyl, benzyl, phenetyl, cyclohexyl, cyclohexylmethyl, hexenyl, decenyl or dodecenyl). It is more preferably a C1-C12 aliphatic group, particularly preferably a C1-C8 aliphatic group. The aryl group represented by $R^{21}$ is, for example, phenyl, naphthyl or anthranil, and is preferably phenyl.

The substituent which they may have is not particularly limited and may be appropriately selected depending on the intended purpose. Preferred examples thereof include halogens (e.g., fluorine, chlorine and bromine), a hydroxyl group, a mercapto group, a carboxyl group, an epoxy group, alkyl groups (e.g., methyl, ethyl, i-propyl, propyl and t-butyl), aryl groups (e.g., phenyl and naphthyl), aromatic heterocyclic groups (e.g., furyl, pyrazoly and pyridyl), alkoxy groups (e.g., methoxy, ethoxy, i-propoxy and hexyloxy), aryloxy groups (e.g., phenoxy), alkylthio groups (e.g., methylthio and ethylthio), arylthio groups (e.g., phenylthio), alkenyl groups (e.g., vinyl and 1-propenyl), alkoxysilyl groups (e.g., trimethoxysilyl and triethoxysilyl), acyloxy groups {e.g., acetoxy and (meth)acryloyl}, alkoxycarbonyl groups (e.g., methoxycarbonyl and ethoxycarbonyl), aryloxycarbonyl groups (e.g., phenoxycarbonyl), carbamoyl groups (e.g., carbamoyl, N-methylcarbamoyl, N,N-dimethylcarbamoyl and N-methyl-N-octylcarbamoyl) and acylamino groups (e.g., acetylamino, benzoylamino, acrylamino and methacrylamino).

Among these substituents, further preferred are a hydroxyl group, a mercapto group, a carboxyl group, an epoxy group, alkyl groups, alkoxysilyl groups, aryloxy groups and acylamino groups, and particularly preferred are an epoxy group, polymerizable acyloxy groups {(meth) acryloyl} and polymerizable acylamino groups (acrylamino and methacrylamino). These substituents may further have substituents.

As described above, $R^{22}$ represents a substituted or unsubstituted alkyl group, and the alkyl group is not particularly limited and is, for example, the same aliphatic group as in $R^{21}$. The substituent which the alkyl group $R^{22}$ may have is the same as in $R^{21}$.

The amount of the compound represented by General Formula (2) is preferably 10% by mass to 80% by mass, more preferably 20% by mass to 70% by mass, further preferably 30% by mass to 50% by mass, relative to the total solid content of the high-refractive-index composition.

Examples of the compound represented by General Formula (2) include compounds described in paragraphs [0054] to [0056] of JP-A No. 2001-166104.

The organic binder in the high-refractive-index composition preferably has a silanol group. When the binder has a silanol group, the fine particle layer is further improved in mechanical strength, resistance to chemicals, and weatherabilty, which is preferred. The silanol group can be introduced into the binder in the following manner, for example. Specifically, an organic silicon compound represented by General Formula (2) having a crosslinkable or polymerizable functional group is incorporated into the high-refractive-index composition together with: a binder precursor (e.g., a curable polyfunctional monomer or oligomer), which is a binder-forming ingredient in the high-refractive-index composition; a polymerization initiator; and a dispersing agent contained in a dispersion liquid of the high-refractiveindex fine particles. The resultant high-refractive-index composition is coated on a transparent support, and the dispersing agent, the polyfunctional monomer or oligomer, and the organic silicon compound represented by General Formula (2) are allowed to perform crosslinking or polymerization reaction.

Hydrolysis reaction/condensation reaction for curing the organic metal compound is preferably performed in the presence of a catalyst. Examples of the catalyst include inorganic acids such as hydrochloric acid, sulfuric acid and nitric acid; organic acids such as oxalic acid, acetic acid, formic acid, trifluoroacetic acid, methanesulfonic acid and toluenesulfonic acid; inorganic bases such as sodium hydroxide, potassium hydroxide and ammonia; organic bases such as triethylamine and pyridine; metal alkoxides such as triisopropoxy aluminum, tetrabutoxy zirconium and tetrabutoxy titanate; and metal chelate compounds such as β-diketones and β-ketoesters. Specific examples thereof include compounds described in paragraphs [0071] to [0083] of JP-A No. 2000-275403.

The amount of the catalyst in the composition is preferably 0.01% by mass to 50% by mass, more preferably 0.1% by mass to 50% by mass, further preferably 0.5% by mass to 10% by mass, relative to the amount of the organic metal compound. Note that, it is preferable to appropriately adjust reaction conditions depending on the reactivity of the organic metal compound.

The matrix in the high-refractive-index composition preferably has a specific polar group. Examples of the specific polar group include anionic groups, an amino group and quaternary ammonium groups. Specific examples of the anionic groups, amino group and quaternary ammonium groups are similar to the groups described regarding the dispersing agent.

—Solvent—

The above solvent is not particularly limited and may be appropriately selected depending on the intended purpose. Examples thereof include alcohols, ketones, esters, amides, ethers, ether esters, hydrocarbons and halogenated hydrocarbons. Specific examples include alcohols such as methanol, ethanol, propanol, butanol, benzyl alcohol, ethylene glycol, propylene glycol and ethylene glycol monoacetate; ketones such as methyl ethyl ketone, methyl isobutyl ketone, cyclohexanone and methylcyclohexanone; esters such as methyl acetate, ethyl acetate, propyl acetate, butyl acetate, ethyl formate, propyl formate, butyl formate and ethyl lactate; aliphatic hydrocarbons such as hexane and cyclohexane; halogenated hydrocarbons such as methylchloroform; aromatic hydrocarbons such as benzene, toluene and xylene; amides such as dimethyl formamide, dimethyl acetamide and n-methylpyrrolidone; ethers such as dioxane, tetrahydrofuran, ethylene glycol dimethyl ether and propylene glycol dimethyl ether; and ether alcohols such as 1-methoxy-2-propanol, ethyl cellosolve and methyl carbinol. These may be used alone or in combination. Among them, toluene, xylene, methyl ethyl ketone, methyl isobutyl ketone, cyclohexanone and butanol are particularly preferred. Besides, preferably used is a coating solvent mainly containing a ketone solvent such as methyl ethyl ketone, methyl isobutyl ketone or cyclohexanone.

The amount of the ketone solvent is preferably 10% by mass or more, more preferably 30% by mass or more, further preferably 60% by mass or more, relative to all the solvents contained in the high-refractive-index composition.

The matrix having a specific polar group can be obtained in the following manner, for example. Specifically, the following ingredients are incorporated into the high-refractive-index composition: a dispersion liquid containing high-refractive-index fine particles and a dispersing agent; a film-forming ingredient which is a combination of a binder precursor having a specific polar group (e.g., a curable polyfunctional monomer or oligomer having a specific polar group) and a polymerization initiator, or the organic silicon compound represented by General Formula (2) having a specific polar group and a crosslinkable or polymerizable functional group, or both of the combination and the organic silicon compound; and an optional monofunctional monomer having a specific polar group and a crosslinkable or polymerizable functional group. The resultant coating composition is coated on a transparent support, and the dispersing agent, the monofunctional monomer, the polyfunctional monomer or oligomer and/or the organic silicon compound represented by General Formula (2) are allowed to perform crosslinking or polymerization reaction.

The monofunctional monomer having a specific polar group can serve as a dispersion aid for the high-refractive-index fine particles in the high-refractive-index composition, which is preferred. Furthermore, when the monofunctional monomer is allowed after coating to perform crosslinking or polymerization reaction with the dispersing agent and the polyfunctional monomer or oligomer to form a binder, it is possible to form a fine particle layer excellent in mechanical strength, resistance to chemicals, and weatherability since the high-refractive-index fine particles are kept dispersed in the fine particle layer favorably uniformly.

A coating liquid containing the high-refractive-index composition and the fine particles added therein is coated on the transparent substrate using a conventionally known thin-film forming method such as a dip coat method, an air knife coat method, a curtain coat method, a roller coat method, a wire bar coat method, a gravure coat method, a microgravure coat method or an extrusion coat method, followed by drying and applying light and/or heat, so that the fine particle layer can be formed. Curing through application of light is preferred since the coating liquid can be cured advantageously rapidly. Furthermore, it is also preferable to apply heat in the latter half of the curing treatment by light.

A light source for the light application may be any light so long as it is in the ultraviolet region or the near infrared region. As for the light source for ultraviolet light, examples thereof include ultra-high pressure mercury lamps, high pressure mercury lamps, medium pressure mercury lamps and low pressure mercury lamps; chemical lamps; carbon arch lamps; metal halide lamps; xenon lamps; and solar light. A variety of available laser light sources of 350 nm to 420 nm in wavelength may be allowed to form multibeams for application. As for the light source for near infrared light, examples thereof include halogen lamps, xenon lamps and high-pressure sodium lamps. A variety of available laser light sources of 750 nm to 1,400 nm in wavelength may be allowed to form multibeams for application.

The photoradical polymerization through application of light can be performed in air or inert gas. However, it is preferable to make the oxygen concentration of an atmosphere for the photoradical polymerization the lowest possible for the purposes of, for example, shortening the time required for initiation of polymerization of the radical polymerizable monomer and sufficiently increasing a degree of polymerization. The irradiation dose of ultraviolet rays applied is preferably 0.1 mW/cm$^2$ to 100 mW/cm$^2$, and the light irradiation dose on the surface of a coating film is preferably 100 mJ/cm$^2$ to 1,000 mJ/cm$^2$. Also, the distribution in temperature of a coating film in a light application step is preferably narrower. It is preferably controlled within ±3° C., more preferably within ±1.5° C. When the distribution in temperature falls within this range, polymerization reaction proceeds uniformly in both an in-plane direction and a depth direction of a coating film, which is preferred.

The average thickness of the fine particle layer is preferably 5 μm to 200 μm, more preferably 5 μm to 50 μm. When the average thickness thereof is less than 5 μm, the fine particle layer cannot exhibit a sufficient effect of changing the angle of light, so that the maximum light extraction efficiency cannot be obtained in some cases. When it is more than 200 μm, light is excessively scattered and back-scattered light increases to increase light returned to the interior of an organic electroluminescent element, leading to a drop in light extraction efficiency. In addition, such a thick fine particle layer may lead to cost elevation.

The above average thickness can be determined from the thicknesses of the fine particle layer measured in the following manner, for example. Specifically, a part of the fine particle layer is cut out and the resultant cut section is observed under a scanning electron microscope (S-3400N, product of Hitachi High-Technologies Corporation) to thereby measure the thicknesses of the fine particle layer, from which the average thickness is determined.

<Organic Electroluminescent Layer>

The organic electroluminescent layer includes at least a light-emitting layer and a transparent electrode; and, if necessary, may include a hole injection layer, a hole transport layer, an electron injection layer, an electron transport layer, and other layers. Each of these layers may be provided with another function. Each layer may be formed using various kinds of materials.

—Light-Emitting Layer—

A material for the light-emitting layer is not particularly limited and may be selected depending on the intended purpose. Examples thereof include those capable of forming layers which have functions of, when an electric potential is applied, injecting holes from an anode, a hole injection layer, and a hole transport layer, injecting electrons from a cathode, an electron injection layer, and an electron transport layer, transporting injected charges, and providing a place for the recombination of electrons and holes causing light emission.

A material for the light-emitting layer is not particularly limited and may be appropriately selected depending on the intended purpose. Examples thereof include benzoxazole derivatives, benzimidazole derivatives, benzothiazole derivatives, styrylbenzen derivatives, polyphenyl derivatives, diphenylbutadiene derivatives, tetraphenyl butadiene derivatives, naphthalimide derivatives, coumarin derivatives, perylene derivatives, perinone derivatives, oxadiazol derivatives, aldazine derivatives, pyralidine derivatives, cyclopentadiene derivatives, bis(styryl) anthracene derivatives, quinacridone derivatives, pyrrolopyridine derivatives, thiadiazolepyridine derivatives, cyclopentadiene derivatives, styrylamine derivatives, aromatic dimethyldine compounds, various metal complexes such as metal/rare metal complexes of 8-quinolinol derivatives, and polymer compounds such as polythiophene, polyphenylene, and polyphenylene vinylene. These may be used alone or in combination.

The thickness of the light-emitting layer is not particularly limited and may be selected depending on the intended purpose. The thickness is preferably 1 nm to 5 μm, more preferably 5 nm to 1 μM, still more preferably 10 nm to 500 nm.

A method for forming the light-emitting layer is not particularly limited and may be appropriately selected depending on the intended purpose. Preferred examples thereof include vapor deposition through resistive heating, electron-beam methods, sputtering, molecular-layering methods, and coating methods (e.g., spin-coat methods), cast methods and dip-coat methods) and LB methods. Among them, vapor deposition through resistive heating and coating methods are particularly preferred.

—Transparent Electrode—

A material for the transparent electrode is not particularly limited and may be appropriately selected depending on the intended purpose. Examples thereof include tin-doped indium oxide (ITO) (refractive index (n)=2.0), zinc-doped indium oxide (IZO), ZnO (refractive index (n)=1.95), $SnO_2$ (refractive index (n)=2.0), $In_2O_3$ (refractive index (n)=1.9 to 2.0) and $TiO_2$ (refractive index (n)=1.90), with ITO and IZO being particularly preferred.

The refractive index of the transparent electrode is preferably 1.65 to 2.2.

The average thickness of the transparent electrode is preferably 20 nm to 200 nm, more preferably 40 nm to 100 nm.

—Hole Injection Layer, Hole Transport Layer—

A material for the hole injection layer or the hole transport layer is not particularly limited and may be appropriately selected depending on the intended purpose so long as it possesses any of the following functions: a function of injecting holes from an anode, a function of transporting holes, and a function of blocking electrons injected from a cathode.

Examples of the material for the hole injection layer or the hole transport layer include carbazole derivatives, triazole derivatives, oxazole derivatives, oxidiazole derivatives, imidazole derivatives, poly(aryl alkane) derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stylben derivatives, silazane derivatives, aromatic tertiary amine compounds, styrylamine compounds, aromatic dimethylidine-derived compounds, porphyrin-derived compounds, polysilane-derived compounds, poly(N-vinylcarbazole) derivatives, aniline-derived copolymers, thiophene oligomers, and electroconductive polymeric oligomers (e.g., polythiophene). These may be used alone or in combination.

The hole injection layer or the hole transport layer may be of either single-layer structure made of one or two or more of the aforementioned materials, or multi-layer structure made of a plurality of layers identical to or different from one another in composition.

Examples of the method for forming the hole injection layer or the hole transport layer include vapor deposition methods, LB methods, and methods by coating a solution or dispersion liquid prepared by dissolving or dispersing the aforementioned hole injection/transport materials in a solvent (e.g., spin-coat methods, cast methods and dip-coat methods). In the cases of these coating methods, the hole injection/transport materials may be dissolved or dispersed in a solvent together with a resin component.

The resin component is not particularly limited and may be appropriately selected depending on the intended purpose. Examples thereof include polyvinylchloride resins, polycarbonate resins, polystyrene resins, polymethyl methacrylate resins, polybutyl methacrylate resins, polyester resins, polysulfone resins, polyphenylene oxide resins, polybutadiene, poly(N-vinylcarbazol) resins, hydrocarbon resins, ketone resins, phenoxy resins, polyamide resins, ethyl cellulose, vinyl acetate resins, ABS resins, polyurethane resins, melamine resins, unsaturated polyester resins, alkyd resins, epoxy resins, and silicone resins. These may be used alone or in combination.

The thickness of the hole injection layer or the hole transport layer is not particularly limited and may be appropriately selected depending on to the intended purpose. The thickness thereof is preferably 1 nm to 5 μm, more preferably 5 nm and 1 μm, still more preferably 10 nm to 500 nm.

—Electron Injection Layer, Electron Transport Layer—

The material for the electron injection layer or the electron transport layer is not particularly limited and may be appropriately selected depending on the intended purpose so long as it possesses any of the following functions: a function of injecting electrons from a cathode, a function of transporting electrons, and a function of blocking holes injected from an anode.

Examples of the material for the electron injection layer or the electron transport layer include triazole derivatives, oxazole derivatives, oxidiazole derivatives, fluorenone derivatives, anthraquinodimethane derivatives, anthrone derivatives, diphenylquinone derivatives, thiopyran dioxide derivatives, carbodiimide derivatives, fluorenylidene methane derivatives, distyrylpyradine derivatives, heterocyclic tetracarboxylic anhydride (e.g., naphthalene and perylene), phthalocyanine derivatives, and various metal complexes represented by metal complexes of 8-quinolinol derivatives, metal phthalocyanine, and metal complexes containing benzoxazole or benzothiazole as a ligand. These may be used alone or in combination.

The electron injection layer or the electron transport layer may be of either single-layer structure made of one or two or more of the aforementioned materials, or multi-layer structure made of a plurality of layers identical to or different from one another in composition.

Examples of the method for forming the electron injection layer or the electron transport layer include vapor-deposition methods, LB methods, and methods by coating a solution or dispersion liquid prepared by dissolving or dispersing the aforementioned hole injection/transport materials in a solvent (e.g., spin-coat methods, cast methods and dip-coat methods). In the cases of these coating methods, the hole injection/transport materials may be dissolved or dispersed in a solvent together with a resin component. As for the resin component, the resins exemplified for the hole injection/transport layers may be used.

The thickness of the electron injection layer or the electron transport layer is not particularly limited and may be appropriately selected depending on the intended purpose. The thickness thereof is preferably 1 nm to 5 μm, more preferably 5 nm to 1 μm, still more preferably 10 nm to 500 nm.

—Other Members—

Examples of the other members include a barrier layer, a protective layer, a seal layer and a TFT substrate.

The barrier layer is not particularly limited and may be appropriately selected depending on the intended purpose so long as it has a function of preventing permeation of atmospheric oxygen, moisture, nitrogen oxides, sulfur oxides, ozone, and the like.

The material for the barrier layer is not particularly limited and any material may be appropriately selected depending on the intended purpose. Examples thereof include SiN and SiON.

The thickness of the barrier layer is not particularly limited and may be appropriately selected depending on the intended purpose. The thickness thereof is preferably 5 nm to 1,000 nm, more preferably 7 nm to 750 nm, particularly preferably 10 nm to 500 nm.

When the thickness of the barrier layer is less than 5 nm, the barrier function of preventing permeation of atmospheric oxygen and moisture may be insufficient. Whereas when the thickness thereof is greater than 1,000 nm, the light transmittance decreases, potentially degrading transparency.

As to optical characteristics of the barrier layer, the light transmittance is preferably 80% or more, more preferably 85% or more, still more preferably 90% or more.

The method for forming the barrier layer is not particularly limited and may be appropriately selected depending on the intended purpose. Examples thereof include CVD methods.

An organic electroluminescent device of the present invention may be configured as a device that can display a full-color image.

As a method for forming a full color-type display of the organic electroluminescent device of the present invention, there are known, for example, as described in "Monthly Display," September 2000, pp. 33 to 37, a tricolor light emission method by arranging, on a substrate, organic EL devices emitting lights corresponding to three primary colors (blue color (B), green color (G) and red color (R)); a white color method by separating white light emitted from an organic EL device for white color emission into three primary colors through a color filter; and a color conversion method by converting a blue light emitted from an organic EL device for blue light emission into red color (R) and green color (G) through a fluorescent dye layer.

Furthermore, by combining a plurality of layer structures emitting lights of different colors which are obtained by the above-described methods, plane-type light sources emitting lights of desired colors can be obtained. For example, there are exemplified white light-emitting sources obtained by combining blue and yellow light emitting devices, and white light-emitting sources obtained by combining blue, green and red light-emitting devices.

Figure 16:
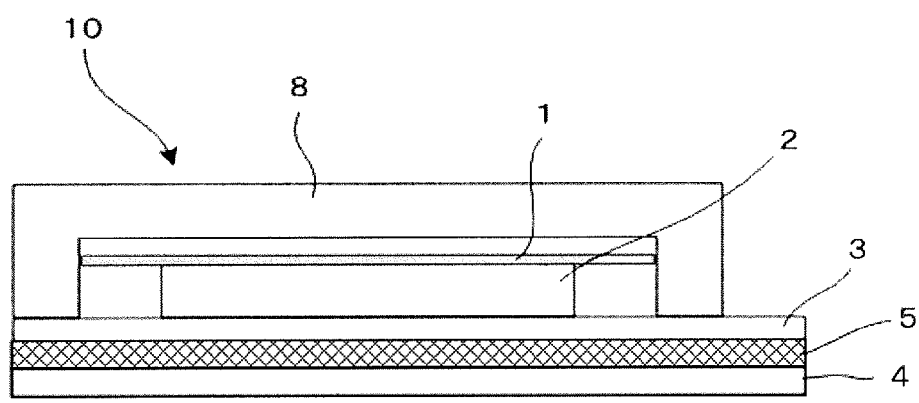
FIG. 16 is a schematic view of one example of an organic electroluminescent device of the present invention.

Here, FIG. 16 is a schematic view of one example of an organic electroluminescent device 10 of the present invention.

The organic electroluminescent device 10 of FIG. 16 includes a fine particle layer 5 and a transparent substrate 4 on the light-emitting surface of a transparent electrode 3.

In addition, the organic electroluminescent device 10 further includes an organic electroluminescent layer 3 and a reflective electrode 1 on the transparent electrode 3, which are sealed by a seal can 8.

The organic electroluminescent device of the present invention can be suitably used in various fields, such as various lights, computers, displays for automobiles, outdoor displays, domestic and commercial devices, domestic appliances, transportation-related displays, clock displays, calendar displays, luminescent screens and audio devices.

EXAMPLES

The present invention will next be described by way of Examples, which should not be construed as limiting the present invention thereto.

Using the below-described model, simulation was performed in the following manner with commercially available ray-tracing software (ZEMAX-EE, product of ZEMAX Development Corporation).

<Simulation Model>

An organic electroluminescent device depicted in FIG. 1 was provided as a simulation model, the organic electroluminescent device containing a composite reflective layer 5, an organic electroluminescent layer (including a transparent electrode) 2, a fine particle layer 3 and a transparent substrate 4 in the order mentioned.

A glass substrate (BK7, product of OHARA INC., refractive index ns=1.5) was used as the transparent electrode 4.

The composite reflective layer 5 is expressed by the type of the reflective electrode and the thickness thereof. The composite reflectivity is calculated from properties of the reflective electrode of the organic electroluminescent layer and properties of the organic electroluminescent layer, and is expressed as the reflectivity of the reflective electrode. The reflectivity of the composite reflective layer is a reflectivity with respect to light returned to the organic electroluminescent layer due to the difference in refractive index between layers.

Here, Ag, MgAg or Al was used as the reflective electrode.

Considering absorption by the organic electroluminescent layer (including a transparent electrode) and the reflective electrode, the composite reflectivity of the organic electroluminescent device was set to 0.87 in the case of an Ag reflective electrode, 0.83 in the case of an MgAg reflective electrode, or 0.77 in the case of an Al reflective electrode.

Hereinafter, the composite reflective layer is referred to simply as the reflective electrode. For example, a composite reflective layer of Ag and having a composite reflectivity of 0.87 is referred to simply as a reflective electrode Ag.

In this organic electroluminescent device, the refractive index ns of the transparent substrate 3 is 1.5, which is lower than the refractive index of the organic electroluminescent layer (1.8).

Also, the fine particle layer 4 is formed of the polymer and fine particles, and polystyrene (refractive index np=1.59, attenuation coefficient k=0) is used as the fine particles.

The refractive index of the polymer in the fine particle layer is equal to or higher than the refractive index of the organic electroluminescent layer.

The distribution of light from the organic electroluminescent layer (including a transparent electrode) 2 (refractive index n=1.8, attenuation coefficient k=0) was set to be a Lambertian distribution.

<Estimation of the Composite Reflectivity of the Organic Electroluminescent Device>

The composite reflectivity of the organic electroluminescent device was estimated in the following manner.

With the transmittance of light travelling between one side and the other side of the organic electroluminescent layer being 0.9, the reflectivities of the reflective electrodes and the organic electroluminescent layer (refractive index n=1.8) were calculated from the Fresnel's equations using typical refractive index and attenuation coefficient of Ag (refractive index n=0.058, attenuation coefficient k=3.58), Mg (refractive index n=0.32, attenuation coefficient k=5.33) or Al (refractive index n=0.93, attenuation coefficient k=6.33). As a result, the reflectivity of Ag was found to be 0.97, the reflectivity of Mg was found to be 0.92, and the reflectivity of Al was found to be 0.86.

The composite reflectivity of the organic electroluminescent device was estimated as follows.
In the case of Ag: 0.97×0.9=0.87
In the case of Mg: 0.92×0.9=0.828
In the case of Al: 0.86×0.9=0.77

The MgAg electrode used was an electrode of an MgAg alloy where Mg:Ag=10:1 (by volume) (MgAg electrode). The composite reflectivity of the MgAg electrode was assumed to be 0.83 by taking into consideration the volume ratios of Mg and Ag and their reflectivities.

<Distribution of Light Emitted from the Organic Electroluminescent Element to the Transparent Substrate>

As the organic electroluminescent element, there was used an organic electroluminescent element disclosed in Vol. 459/14 May 2009/doi: 10. 1038/nature08003 and having the following structure:
air/glass (BK7, product of OHARA INC., refractive index: 1.5, attenuation coefficient k=0, thickness: 1 mm)/ITO (thickness: 90 nm)/MeO-TPD: NDP-2 (thickness: 45 nm)/NPB (thickness: 10 nm)/TCTA: Ir(MDQ)$_2$(acac) (thickness: 6 nm)/TCTA (thickness: 2 nm)/TPBi: Flrpic (4 nm)/TPBi (thickness: 2 nm)/TPBi:Ir(ppy)$_3$/TPBi (10 nm)/Bphen: Cs (thickness: 25 nm)/Ag (thickness: 100 nm).

Note that, as described in paragraph [0002] of JP-A No. 2008-70198, the distribution of light emitted from the light-emitting layer to the transparent substrate was considered to be a Lambertian distribution.

<Light Extraction Efficiency>

Light extraction efficiency=(Energy of light emitted to the air)/(Energy of light emitted from an effective light-emitting region)

<Factor of Integral Efficiency>

Factor=(Light extraction efficiency when the fine particle layer is present)/(Light extraction efficiency when the fine particle layer is absent)

Example 1

Simulation 1

—In each reflective electrode, effects on the light extraction efficiency when the size of the effective light-emitting region is changed with respect to the thickness of the element—
<<Simulation Model>>

As depicted in FIG. 1, a specific configuration of the simulation model is as follows:
air/transparent substrate 4 (refractive index ns=1.5, attenuation coefficient k=0, thickness: 1 mm)/fine particle layer 5 (polystyrene fine particles: average particle diameter ϕ=2 μm, refractive index np=1.59, attenuation coefficient k=0, filling rate by volume n=50%; polymer: refractive index nb=1.8, attenuation coefficient k=0, thickness=15 μm)/organic electroluminescent layer 2 (refractive index n=1.8, attenuation coefficient k=0, thickness: 0.2 μm)/composite reflective layer 6 (Ag: reflectivity 0.87, MgAg: reflectivity 0.83, Al: reflectivity 0.77, thickness: 100 nm).

Using commercially available ray-tracing software (ZEMAX-EE, product of ZEMAX Development Corporation), simulation was performed about the relationship between the ratio (w/d) and the light extraction efficiency, where as depicted in FIG. 1, "w" denotes the minimum width of a non-light-emitting region present outside of the outer periphery of an effective light-emitting region of a 5 mm×5 mm square in the organic electroluminescent layer and "d" denotes the total average thickness of the organic electroluminescent layer, the fine particle layer and the transparent substrate when the size of the non-light-emitting region present outside of the outer periphery of the effective light-emitting region was changed.

<<Simulation Results>>

Figure 2:
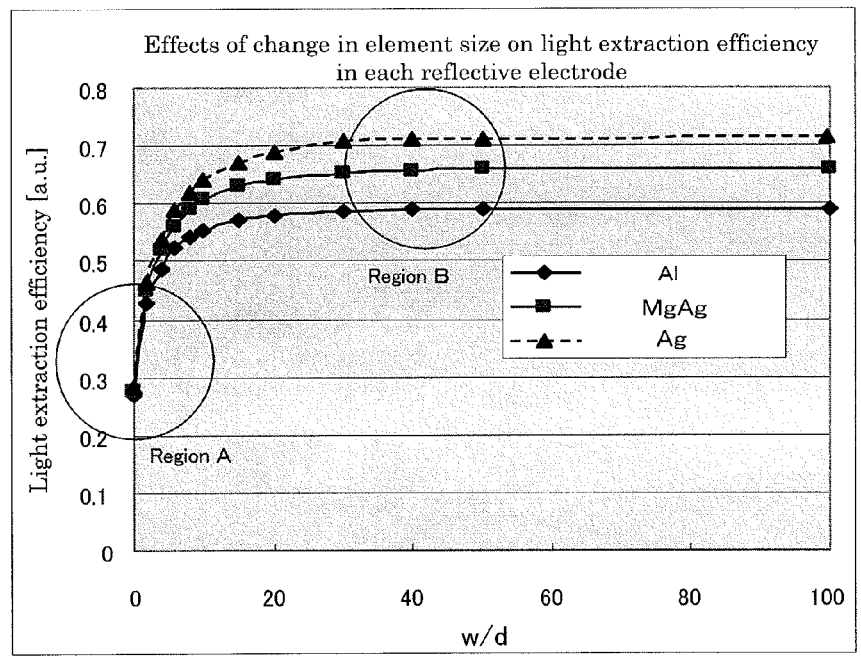
FIG. 2 is a graph of a relationship between a ratio (w/d) and light extraction efficiency in the case of each of an Ag reflective electrode, an MgAg reflective electrode and an Al reflective electrode.

FIG. 2 is a graph of the relationship between the ratio (w/d) and the light extraction efficiency in the case of each of the Ag reflective electrode, the MgAg reflective electrode and the Al reflective electrode.

From the results of FIG. 2, the light extraction efficiency was higher in the Ag reflective electrode than in the MgAg reflective electrode and the Al reflective electrode in the configuration where the ratio (w/d) was large.

Figure 3:
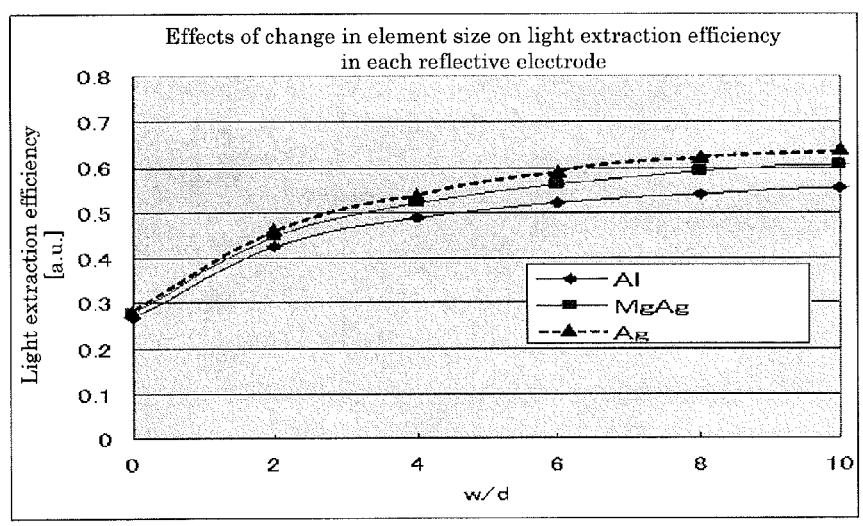
FIG. 3 is an enlarged graph of region A in FIG. 2.

FIG. 3 is an enlarged graph of region A in FIG. 2. From the results of FIG. 3, almost no difference was observed among the reflective electrodes when the ratio (w/d) was 0. Meanwhile, the light extraction efficiency was the highest in the Ag reflective electrode in region B in FIG. 2 where the ratio (w/d) was large.

Next, the light extraction efficiency depicted in FIG. 2 is normalized in the following manner.

(1) In order to express the effects of the ratio (w/d), the light extraction efficiency when w=0 (i.e., background) is subtracted from each light extraction efficiency in each reflective electrode (when w=0, the light extraction efficiency is regarded as 0).

(2) The light extraction efficiency when the ratio (w/d)=100 at which the light extraction efficiency stopped increasing was regarded as 1. Thus normalized results are presented in FIG. 4.

Figure 4:
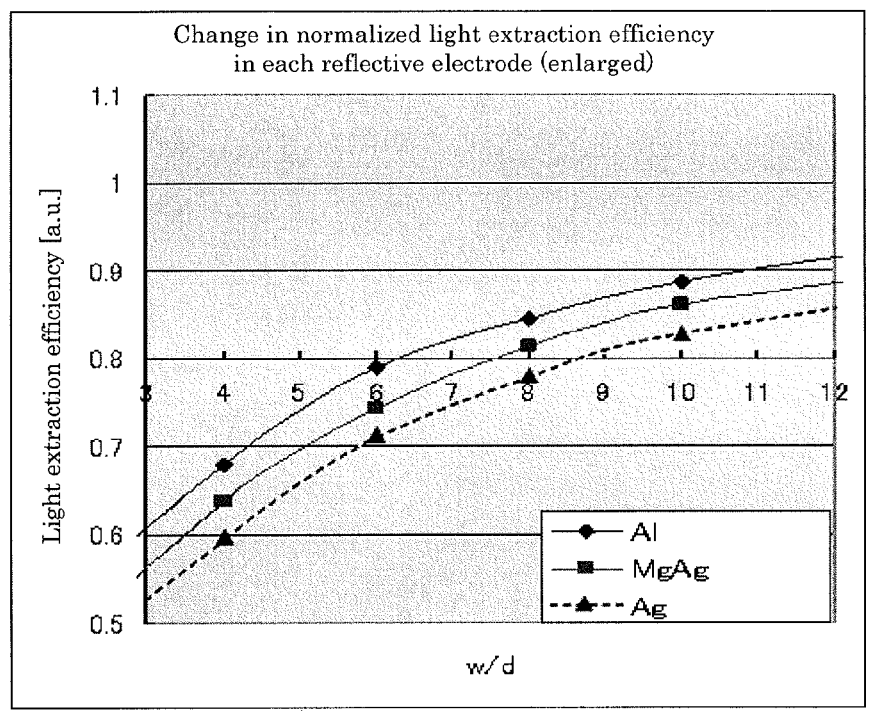
FIG. 4 is a graph of normalized results of the light extraction efficiency presented in FIG. 2.

From the results of FIG. 4, the Ag reflective electrode requires a larger ratio (w/d) in order to attain an increase in light extraction efficiency comparable to the MgAg reflective electrode and the Al reflective electrode. Also, in the case of the Ag reflective electrode, the ratio (w/d) is preferably 9 or more in order to attain light extraction efficiency 0.8 times the maximum light extraction efficiency.

Example 2

Simulation 2

—In each reflective electrode, optimization of the fine particle layer in terms of the refractive index of the polymer, the average particle diameter of the fine particles, and the filling rate by volume of the fine particles—

<<Simulation Model>>

Using commercially available ray-tracing software (ZE-MAX-EE, product of ZEMAX Development Corporation), simulation was performed about the effects on the light extraction efficiency by changing the parameters of the fine particle layer. Here, based on the point at which the light extraction efficiency in the case of the Ag reflective electrode, the MgAg reflective electrode or the Al reflective electrode stopped increasing in FIG. 2 of Simulation 1, the effective light-emitting region is a mm×5 mm square and the entire element is a 40 mm×40 mm square.

Figure 5:
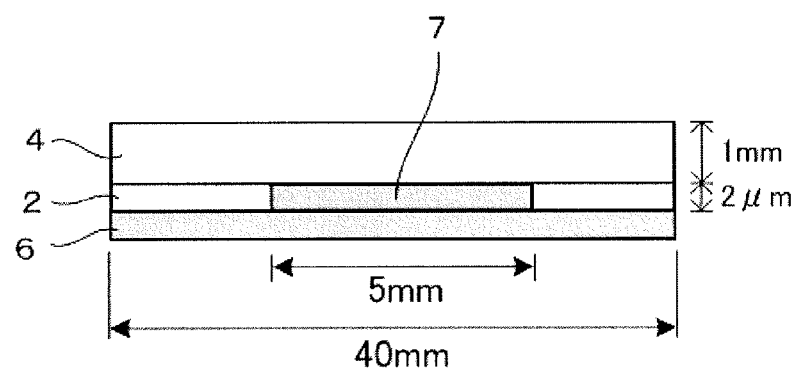
FIG. 5 is a schematic view of a simulation model used in Simulation 2 of Example 2, where a fine particle layer is absent.

(1) Model where the Fine Particle Layer is Absent (See FIG. 5)

Air/transparent substrate 4 (BK7, product of OHARA INC., refractive index n=1.5, attenuation coefficient k=0, thickness=1 mm)/organic electroluminescent layer 2 (refractive index n=1.8, attenuation coefficient k=0, thickness: 2 μm)/composite reflective layer 6 (reflective electrode Al, resistivity: 0.86×0.9=0.77, thickness: 100 nm)

Figure 6:
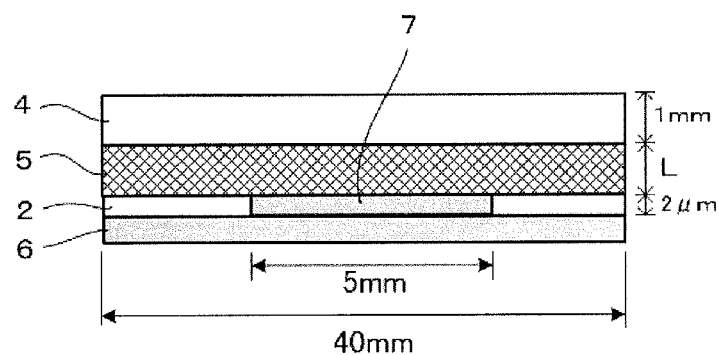
FIG. 6 is a schematic view of a simulation model used in Simulation 2 of Example 2, where a fine particle layer is present.

(2) Model where the Fine Particle Layer is Present (See FIG. 6)

Air/transparent substrate 4 (refractive index ns=1.5, attenuation coefficient k=0, thickness: 1 mm)/fine particle layer 5 (polymer: refractive index nb, attenuation coefficient k=0, the thickness of the fine particle layer: L; fine particles: refractive index n=1.59, attenuation coefficient k=0, particle diameter φ, filling rate by volume η/organic electroluminescent layer 2 (refractive index n=1.8, attenuation coefficient k=0, thickness: 2 μm)/composite reflective layer 6 (thickness: 100 nm). Here, the reflectivity of the composite reflective layer was set to the following value: 0.77 (=0.86× 0.9) in the case of Al, 0.87 (=0.97×0.9) in the case of Ag, or 0.828 (=0.92×0.9) in the case of Mg. Also, in the case of an MgAg alloy, assuming that this MgAg electrode is an electrode where Mg:Ag=10:1 (by volume) (MgAg electrode), the reflectivity of the composite reflective layer was assumed to be 0.83 by taking into consideration the volume ratios of Mg and Ag and their reflectivities.

The fine particles used were polystyrene spherical particles (refractive index n=1.59, attenuation coefficient k=0). The polymer used in the fine particle layer was a dispersion where high-refractive-index nanoparticles ($TiO_2$, refractive index n=2.6, average particle diameter: 100 nm or less) was dispersed in urethane (refractive index n=1.5).

Using commercially available ray-tracing software (ZE-MAX-EE, product of ZEMAX Development Corporation), simulation was performed about the refractive index nb of the polymer in the fine particle layer, the thickness L of the fine particle layer, the average particle diameter φ of the fine particles, the filling rate by volume of the fine particles, the refractive index ns (=1.5) of the transparent substrate in the Ag reflective electrode, the MgAg reflective electrode (Mg:Ag=10:1 (by volume)) or the Al reflective electrode, assuming that the distribution of light emitted from an effective light-emitting region of the organic electroluminescent layer was a Lambertian distribution. Then, light extraction efficiency and changes in factor of integral efficiency were estimated in the following manner.

<<Simulation Results>>

Figure 7:
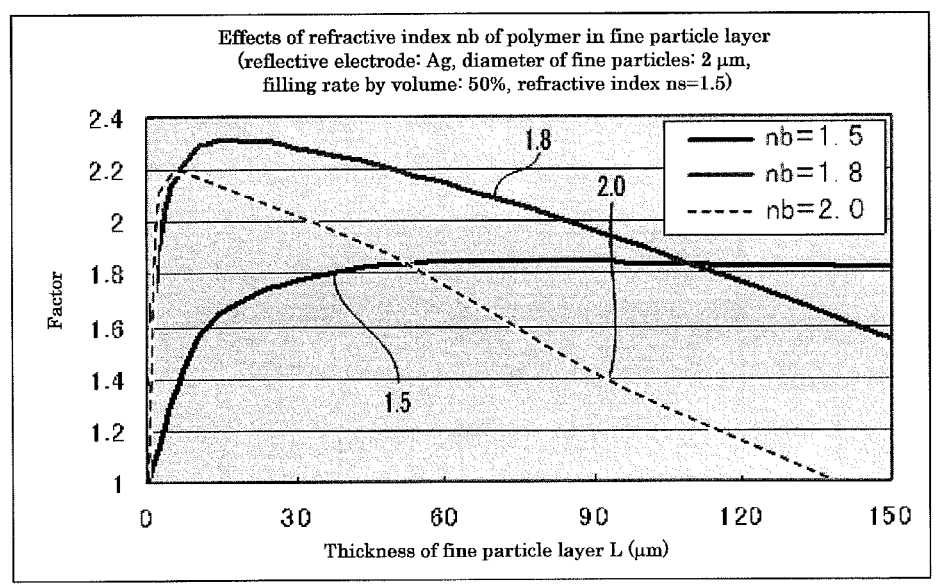
FIG. 7 is a graph of a relationship between the thickness of a fine particle layer and the factor of an integral efficiency when each of the refractive index nb of a polymer in the fine particle layer and the refractive index ns of a transparent substrate is 1.5, 1.8 or 2.0.

(1) Effects of the Refractive Index Nb of the Polymer in the Fine Particle Layer FIG. 7 is a graph of a relationship between the thickness L of the fine particle layer and the factor of the integral efficiency in the case of the Ag reflective electrode when the average particle diameter of the polymer in the fine particle layer was 2 μm, the filling rate by volume of the fine particles was 50%, the refractive index ns of the transparent substrate was 1.5, and the refractive index nb of the polymer in the fine particle layer was 1.5, 1.8 or 2.0.

Figure 8:
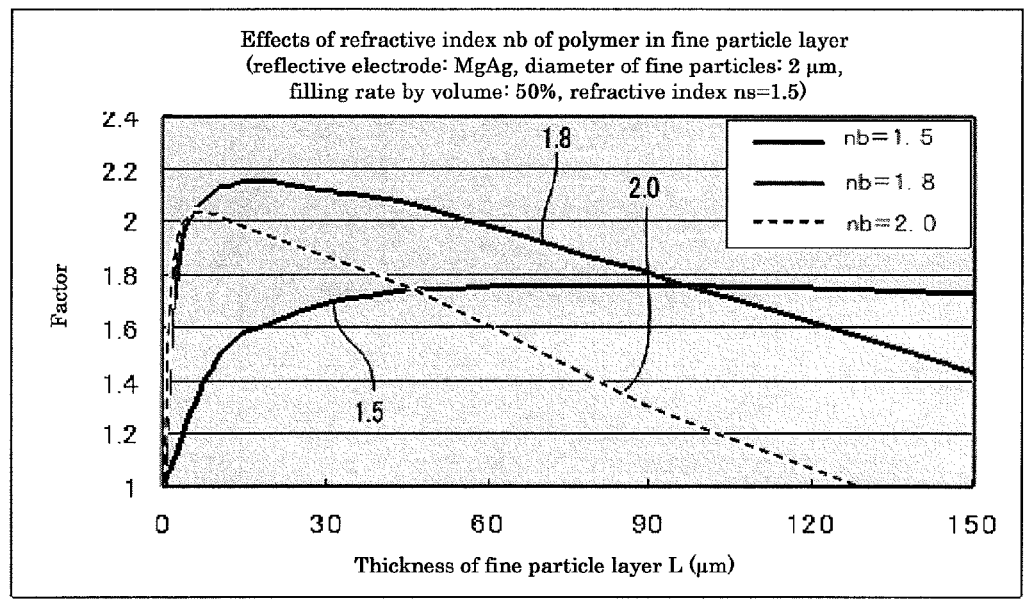
FIG. 8 is a graph of a relationship between the thickness of a fine particle layer and the factor of an integral efficiency when each of the refractive index nb of a polymer in the fine particle layer and the refractive index ns of a transparent substrate is 1.5, 1.8 or 2.0.

FIG. 8 is a graph of a relationship between the thickness L of the fine particle layer and the factor of the integral efficiency in the case of the MgAg reflective electrode when the average particle diameter of the polymer in the fine particle layer was 2 μm, the filling rate by volume of the fine particles was 50%, the refractive index ns of the transparent substrate was 1.5, and the refractive index nb of the polymer in the fine particle layer was 1.5, 1.8 or 2.0.

Figure 9:
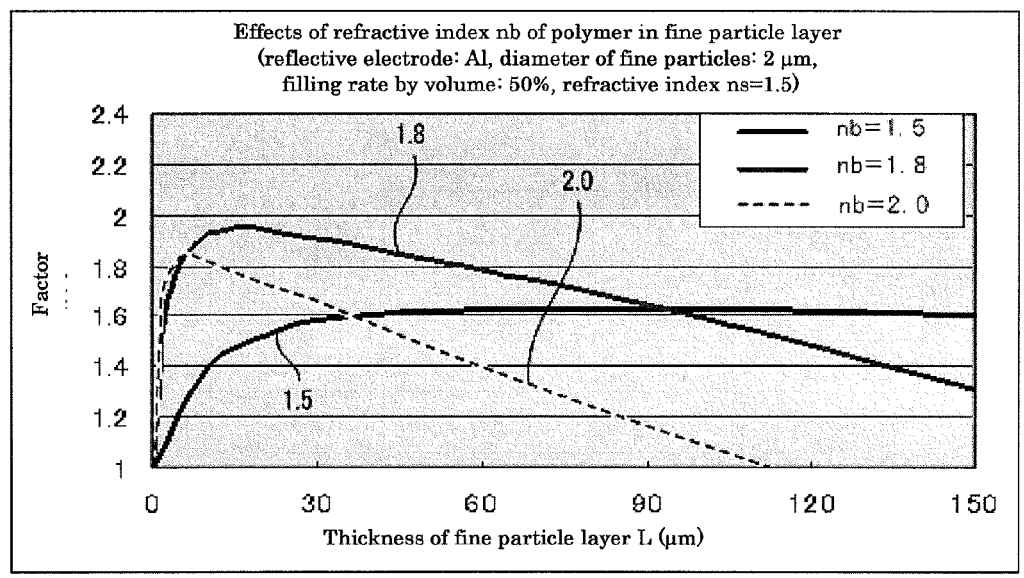
FIG. 9 is a graph of a relationship between the thickness of a fine particle layer and the factor of an integral efficiency when each of the refractive index nb of a polymer in the fine particle layer and the refractive index ns of a transparent substrate is 1.5, 1.8 or 2.0.

FIG. 9 is a graph of a relationship between the thickness L of the fine particle layer and the factor of the integral efficiency in the case of the Al reflective electrode when the average particle diameter of the polymer in the fine particle layer was 2 μm, the filling rate by volume of the fine particles was 50%, the refractive index ns of the transparent substrate was 1.5, and the refractive index nb of the polymer in the fine particle layer was 1.5, 1.8 or 2.0.

From the results of FIGS. 7 to 9, when the refractive index nb of the polymer in the fine particle layer is 1.8, the light extraction efficiency is maximum, and when nb=2.0 (which is 2.0/1.8 times the refractive index of the organic electroluminescent layer), the light extraction efficiency decreases.

Furthermore, as the refractive index nb of the polymer in the fine particle layer is larger, the maximum light extraction efficiency is obtained when the thickness of the fine particle layer is smaller.

Figure 10:
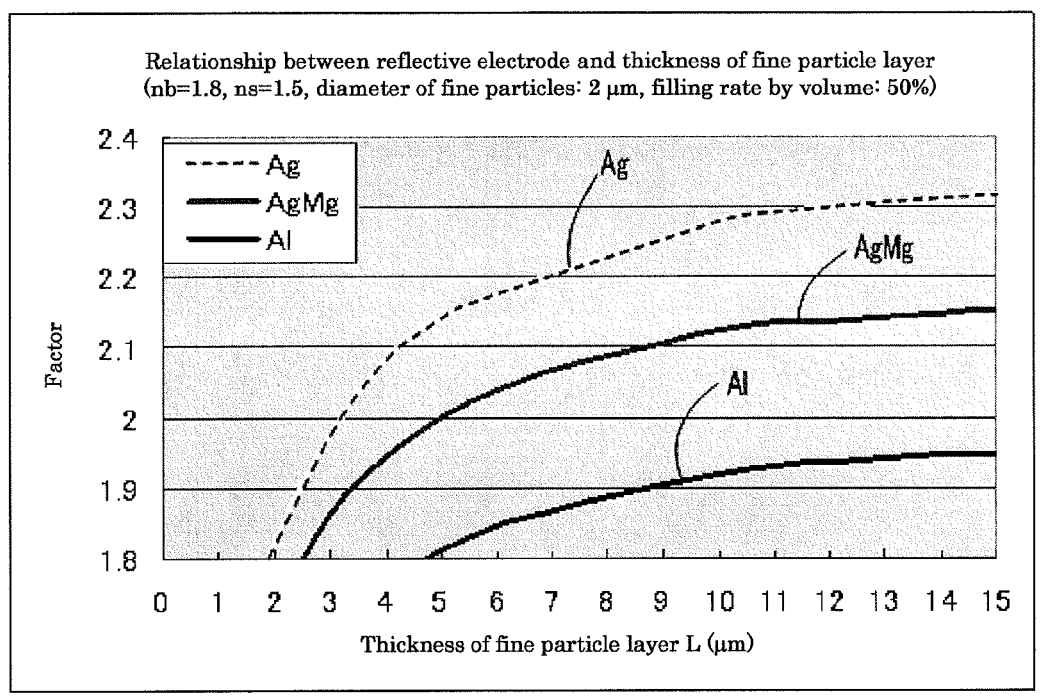
FIG. 10 is a graph of a relationship between the thickness of a fine particle layer and the factor of an integral efficiency in the case of each of an Ag reflective electrode, an AgMg reflective electrode and an Al reflective electrode.

FIG. 10 is a graph of a relationship between the thickness L of the fine particle layer and the factor of the integral efficiency in the case of each of the Ag reflective electrode, the AgMg reflective electrode and the Al reflective electrode when the refractive index nb of the polymer in the fine particle layer was 1.8, the refractive index ns of the transparent substrate was 1.5, the average particle diameter of the polymer in the fine particle layer was 2 μm, and the filling rate by volume of the fine particles was 50%.

From the results of FIG. 10, the light extraction efficiency is higher in the Ag reflective electrode than in the AgMg reflective electrode and the Al reflective electrode when the fine particle layer has the same thickness.

In the case where the same fine particles and the same polymer in the fine particle layer are used, the Ag reflective electrode realizes the same light extraction efficiency as in the AgMg reflective electrode and the Al reflective electrode with the fine particle layer having a smaller thickness than in the AgMg reflective electrode and the Al reflective electrode. That is, it was found to be possible to achieve reduction of the cost for the fine particle layer and a high production yield of the fine particle layer.

<<Effects of the Average Particle Diameter of the Fine Particles, the Filling Rate by Volume of the Fine Particles, and the Thickness of the Fine Particle Layer>>

Figure 11:
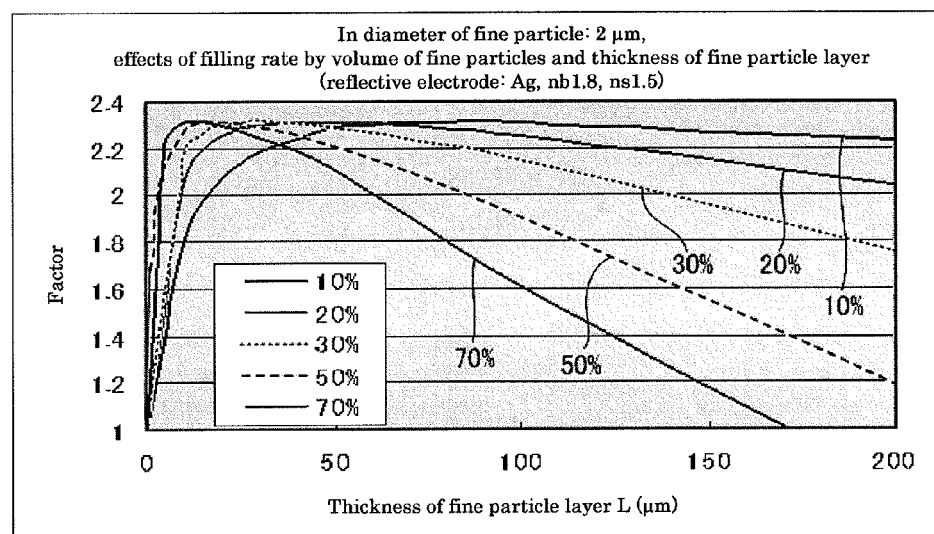
FIG. 11 is a graph of a relationship between the thickness of a fine particle layer and the factor of an integral efficiency when the filling rate by volume of fine particles is 10%, 20%, 30%, 50% or 70%.

FIG. 11 is a graph of a relationship between the thickness L of the fine particle layer and the factor of the integral efficiency in the case of the Ag reflective electrode when the average particle diameter of the fine particles in the fine particle layer was 2 μm, the refractive index nb of the polymer in the fine particle layer was 1.8, the refractive index ns of the transparent substrate was 1.5, and the filling rate by volume of the fine particles was 10%, 20%, 30%, 50% or 70%.

Figure 12:
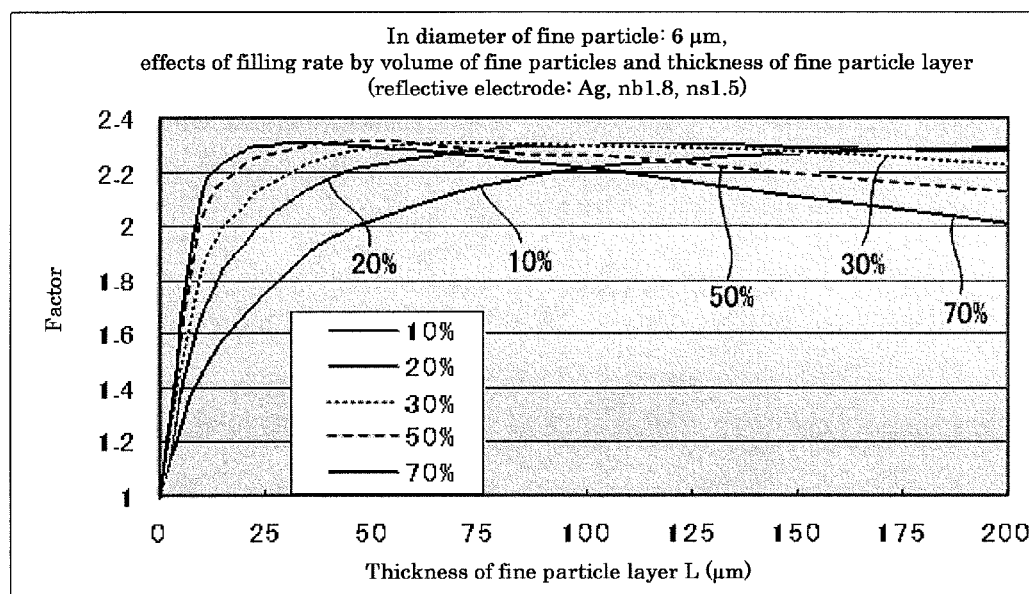
FIG. 12 is a graph of a relationship between the thickness of a fine particle layer and the factor of an integral efficiency when the filling rate by volume of fine particles is 10%, 20%, 30%, 50% or 70%.

FIG. 12 is a graph of a relationship between the thickness L of the fine particle layer and the factor of the integral efficiency in the case of the Ag reflective electrode when the average particle diameter of the fine particles in the fine particle layer was 6 μm, the refractive index nb of the polymer in the fine particle layer was 1.8, the refractive index ns of the transparent substrate was 1.5, and the filling rate by volume of the fine particles was 10%, 20%, 30%, 50% or 70%.

Figure 13:
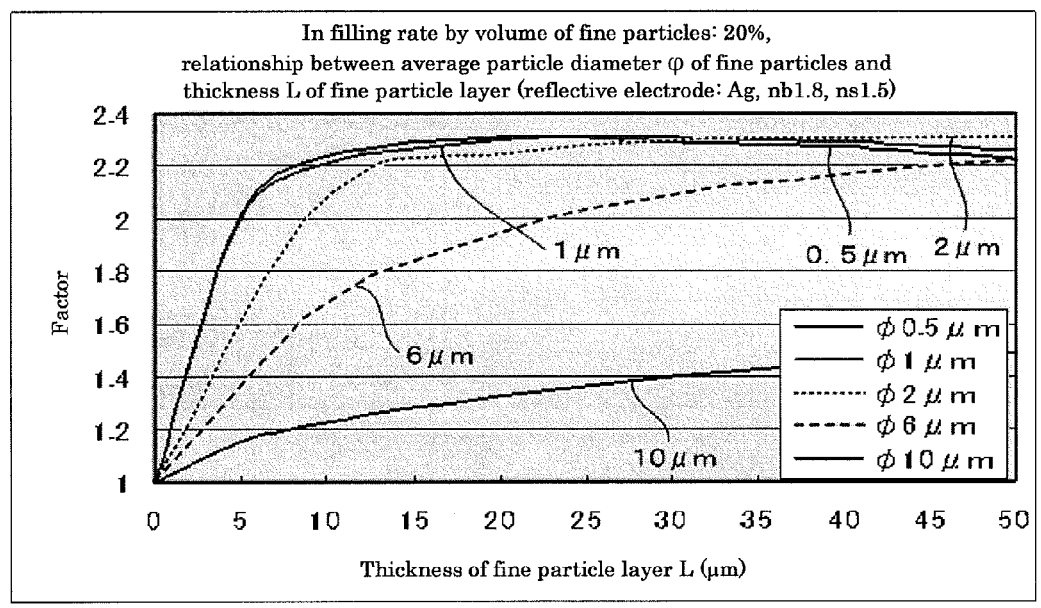
FIG. 13 is a graph of a relationship between the thickness of a fine particle layer and the factor of an integral efficiency when the average particle diameter of fine particles is 0.5 µm, 1 µm, 2 µM, 6 µm or 10 µm.

FIG. 13 is a graph of a relationship between the thickness of the fine particle layer and the factor of the integral efficiency in the case of the Ag reflective electrode when the filling rate by volume of the fine particles in the fine particle layer was 20%, the refractive index nb of the polymer in the fine particle layer was 1.8, the refractive index ns of the transparent substrate was 1.5, and the average particle diameter of the fine particles was 0.5 μm, 1 μm, 2 μm, 6 μm or 10 μm.

Figure 14:
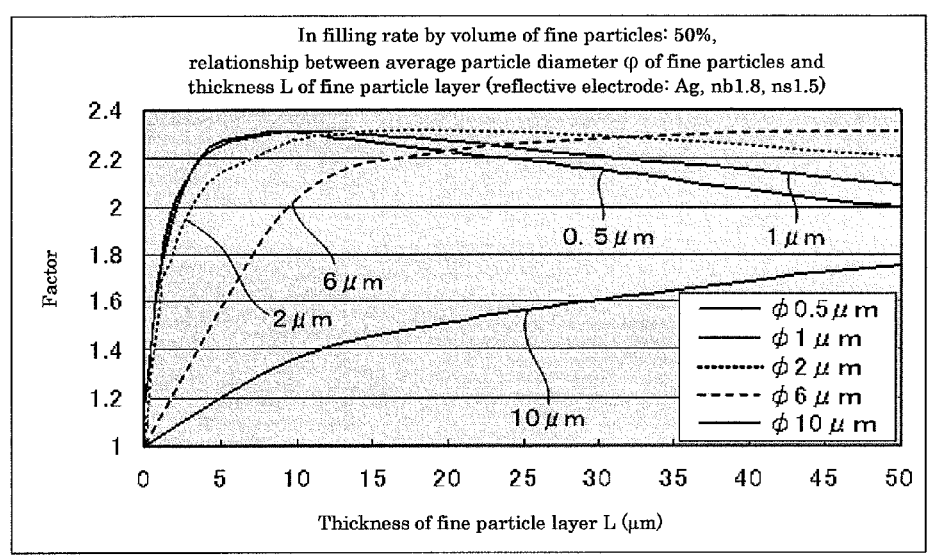
FIG. 14 is a graph of a relationship between the thickness of a fine particle layer and the factor of an integral efficiency when the average particle diameter of fine particles is 0.5 µm, 1 µm, 2 µm, 6 µm or 10 µm.

FIG. 14 is a graph of a relationship between the thickness of the fine particle layer and the factor of the integral efficiency in the case of the Ag reflective electrode when the filling rate by volume of the fine particles in the fine particle layer was 50%, the refractive index nb of the polymer in the fine particle layer was 1.8, the refractive index ns of the transparent substrate was 1.5, and the average particle diameter of the fine particles was 0.5 μm, 1 μm, 2 μm, 6 μm or 10 μm.

From the results of FIGS. 11 to 14, the thickness of the fine particle layer is adjusted considering the average particle diameter and the filling rate by volume of the fine particles in the fine particle layer to thereby optimize the light extraction efficiency. The thus-optimized light extraction efficiency is defined as optimized light extraction efficiency.

The value of the optimized light extraction efficiency is determined based on the material of the reflective electrode, the refractive index of the transparent substrate and the refractive index of the polymer in the fine particle layer. The smaller the average particle diameter of the fine particles is, the smaller the optimal thickness of the fine particle layer is. The lower the filling rate by volume of the fine particles is, the larger the optimal thickness of the fine particle layer is.

In general, since the high-refractive-index polymer in the fine particle layer is an expensive material, the thickness of the fine particle layer is preferably smaller so long as the thickness thereof is a controllable thickness.

When the average particle diameter of the fine particles is 10 μm or more, such fine particles mainly scatter light forward, so that they have a low ability to change the angle of light, leading to a drop in light extraction efficiency. Whereas when the average particle diameter of the fine particles is less than 0.5 μm, Mie scattering is changed to Rayleigh scattering, which presumably causes a great change in chromaticity of the element and a drop in light extraction efficiency. Therefore, it is found that the average particle diameter of the fine particles is preferably 0.5 μm to 10 μm.

When the thickness of the fine particle layer is 50 μm or smaller, the filling rate by volume of the fine particles can be reduced to attain cost reduction, which is advantageous. In the case where the thickness of the fine particle layer is smaller than 50 μm, the maximum integral efficiency can be obtained when the average particle diameter of the fine particles is 0.5 μm to 6 μm.

In addition, in any of the 10% to 70% filling rates by volume of the fine particles, the same factor of the integral efficiency can be obtained by optimally selecting the thickness of the fine particle layer. A range of the filling rate by volume of the fine particles over which the maximum factor of the integral efficiency can be obtained when the thickness of the fine particle layer is 50 μm or smaller is 20% to 70%. Therefore, preferably, the average particle diameter of the fine particles is 0.5 μm to 6 μm, the filling rate by volume of the fine particles is 20% to 70%, and the thickness of the fine particle layer is 50 μm or smaller.

<<Effects of the Refractive Index of the Transparent Substrate on the Light Extraction Efficiency>>

Figure 15:
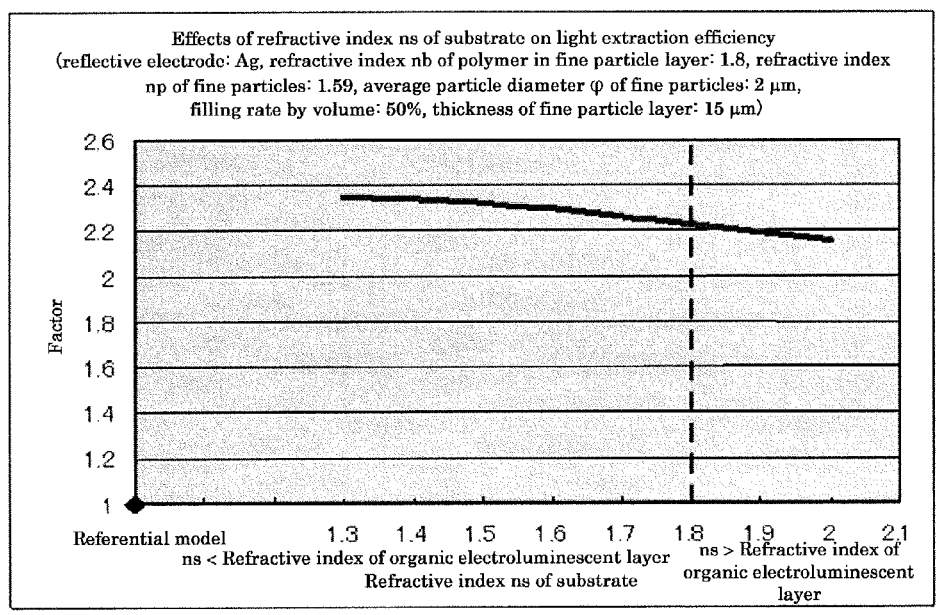
FIG. 15 is a graph of a relationship between the refractive index of a substrate and the factor of light extraction efficiency.

FIG. 15 is a graph of a relationship between the refractive index ns of the transparent substrate and the factor of light extraction efficiency in the simulation model depicted in FIG. 6.

The graph of FIG. 15 indicates that the light extraction efficiency is high when the refractive index ns of the transparent substrate is lower than the refractive index (1.8) of the organic electroluminescent layer. This is possibly because the transparent substrate, having a refractive index of lower than the refractive index of the polymer in the fine particle layer (which is equal to the refractive index of the organic electroluminescent layer), reduced the difference in refractive index between the fine particle layer and the air.

Meanwhile, the transparent substrate having a refractive index of higher than the refractive index of the polymer in the fine particle layer (which is equal to the refractive index of the organic electroluminescent layer) makes the difference in refractive index between the transparent substrate and the air larger than the original difference in refractive index therebetween. As a result, Fresnel reflection occurs more and the light extraction efficiency decreases.

Therefore, it was found that the refractive index ns of the transparent substrate is preferably lower than the refractive index nb of the polymer in the fine particle layer (which is equal to the refractive index of the organic electroluminescent layer).

From the above discussion, it was possible to realize the configuration of an organic electroluminescent device 10 depicted in FIG. 16 including: a reflective electrode 1; an organic electroluminescent layer 2; a transparent electrode 3; a fine particle layer 5; and a transparent substrate 4 in the order mentioned. Note that, reference numeral 8 in FIG. 16 denotes a seal can.

INDUSTRIAL APPLICABILITY

The organic electroluminescent device of the present invention is excellent in external extraction efficiency of emitted light and able to achieve reduced consumption power and long service life, and thus can be suitably used in various fields, such as various lights, computers, displays for automobiles, outdoor displays, domestic and commercial devices, domestic appliances, transportation-related displays, clock displays, calendar displays, luminescent screens and audio devices.

REFERENCE NUMERAL LIST

1 Reflective electrode
2 Organic electroluminescent layer
4 Transparent substrate
5 Fine particle layer
6 Composite reflective layer
7 Effective light-emitting region
8 Seal can
10 Organic electroluminescent device

The invention claimed is:

1. An organic electroluminescent device comprising, in the following order:
   a reflective electrode;
   an organic electroluminescent layer;
   a light extraction layer; and
   a transparent substrate,
   wherein a ratio (w/d) is 9 or more where "d" denotes a total average thickness from the organic electroluminescent layer to the transparent substrate and "w" denotes a minimum width of a non-light-emitting region present outside of an outer periphery of an effective light-emitting region in the organic electroluminescent layer.

2. The organic electroluminescent device according to claim 1, wherein the total average thickness "d" from the organic electroluminescent layer to the transparent substrate is a total average thickness of the organic electroluminescent layer, the light extraction layer and the transparent substrate.

3. The organic electroluminescent device according to claim 1, wherein light emitted from the organic electroluminescent layer is emitted from the transparent substrate.

4. The organic electroluminescent device according to claim 1, wherein the reflective electrode is made of Ag.

5. The organic electroluminescent device according to claim 1, wherein a refractive index of the transparent substrate is lower than a refractive index of the organic electroluminescent layer.

6. The organic electroluminescent device according to claim 1, wherein the light extraction layer is a fine particle layer containing a polymer and fine particles.

7. The organic electroluminescent device according to claim 6, wherein a refractive index of the polymer in the fine particle layer is different from a refractive index of the fine particles.

8. The organic electroluminescent device according to claim 6, wherein a refractive index of the polymer in the fine particle layer is equal to or higher than the refractive index of the organic electroluminescent layer.

9. The organic electroluminescent device according to claim 6, wherein the fine particles have an average particle diameter of 0.5 μm to 10 μm.

10. The organic electroluminescent device according to claim 6, wherein a filling rate by volume of the fine particles in the fine particle layer is 20% to 70%.

11. The organic electroluminescent device according to claim 6, wherein the fine particle layer has an average thickness of 5 μm to 200 μm.

12. The organic electroluminescent device according to claim 1, wherein the total average thickness "d" from the organic electroluminescent layer to the transparent substrate is 200 μm to 1,500 μm.

13. The organic electroluminescent device according to claim 1, wherein the total average thickness "d" from the organic electroluminescent layer to the transparent substrate is 500 μm to 1,000 μm.

* * * * *